(12) United States Patent
Yamaoka et al.

(10) Patent No.: US 12,376,448 B2
(45) Date of Patent: Jul. 29, 2025

(54) LIGHT-EMITTING DEVICE, LIGHT-EMITTING APPARATUS, LIGHT-EMITTING MODULE, ELECTRONIC DEVICE, AND LIGHTING DEVICE

(71) Applicant: SEMICONDUCTOR ENERGY LABORATORY CO., LTD., Atsugi (JP)

(72) Inventors: Ryohei Yamaoka, Kanagawa (JP); Naoaki Hashimoto, Kanagawa (JP); Tsunenori Suzuki, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 888 days.

(21) Appl. No.: 17/598,549

(22) PCT Filed: Apr. 1, 2020

(86) PCT No.: PCT/IB2020/053071
§ 371 (c)(1),
(2) Date: Sep. 27, 2021

(87) PCT Pub. No.: WO2020/208474
PCT Pub. Date: Oct. 15, 2020

(65) Prior Publication Data
US 2022/0173347 A1    Jun. 2, 2022

(30) Foreign Application Priority Data

Apr. 12, 2019  (JP) .................................. 2019-076244

(51) Int. Cl.
*H10K 50/16* (2023.01)
*H10K 50/11* (2023.01)
(Continued)

(52) U.S. Cl.
CPC ............. *H10K 50/16* (2023.02); *H10K 50/11* (2023.02); *H10K 50/15* (2023.02); *H10K 50/171* (2023.02);
(Continued)

(58) Field of Classification Search
CPC ........................... H10K 50/16; H10K 50/125
See application file for complete search history.

(56) References Cited

U.S. PATENT DOCUMENTS 7,807,839 B2   10/2010   Inoue et al.
8,299,458 B2   10/2012   Terao et al.
(Continued)

FOREIGN PATENT DOCUMENTS

CN   101803057 A   8/2010
DE   112008002449   10/2010
(Continued)

OTHER PUBLICATIONS

Choi et al., Jpn. J. Appl. Phys. 48, 2009, 062101.*
(Continued)

*Primary Examiner* — Vu A Nguyen
(74) *Attorney, Agent, or Firm* — Fish & Richardson P.C.

(57) ABSTRACT

A light-emitting device with a long lifetime is provided. A light-emitting device with high reliability is provided. The light-emitting device includes a first electrode, a first light-emitting layer, a first layer, a second layer, a third layer, a second light-emitting layer, and a second electrode stacked in this order. The first layer contains a first organic compound and a first substance. The second layer contains a second organic compound. The third layer contains a second substance. The first organic compound is an electron-transport material. The first substance is a metallic salt, a metal oxide, or an organometallic salt. The second organic compound is an electron-transport material. The second sub-
(Continued)

stance is an electron-injection material. The second layer has a lower concentration of the first substance than the first layer.

22 Claims, 15 Drawing Sheets

(51) Int. Cl.
    *H10K 50/15* (2023.01)
    *H10K 50/17* (2023.01)
    *H10K 85/60* (2023.01)
    *H10K 101/40* (2023.01)

(52) U.S. Cl.
    CPC ....... *H10K 85/626* (2023.02); *H10K 85/6572* (2023.02); *H10K 2101/40* (2023.02)

(56) References Cited

U.S. PATENT DOCUMENTS

| | | | |
|---|---|---|---|
| 9,048,441 B2 | 6/2015 | Inoue et al. | |
| 9,373,799 B2 | 6/2016 | Inoue et al. | |
| 9,793,498 B2 | 10/2017 | Inoue et al. | |
| 9,831,457 B2 * | 11/2017 | Kang | H10K 50/82 |
| 9,929,368 B2 * | 3/2018 | Kataishi | H10K 50/19 |
| 10,418,565 B2 * | 9/2019 | Seo | H10K 85/6572 |
| 2011/0233525 A1 | 9/2011 | Terao et al. | |
| 2017/0062749 A1 * | 3/2017 | Seo | H10K 50/115 |
| 2021/0249619 A1 | 8/2021 | Seo et al. | |
| 2021/0367177 A1 | 11/2021 | Seo et al. | |

FOREIGN PATENT DOCUMENTS

| | | | | |
|---|---|---|---|---|
| EP | 2435399 B1 * | 1/2018 | ........... | C07C 209/10 |
| JP | 2007-137872 A | 6/2007 | | |
| JP | 2007-179933 A | 7/2007 | | |
| JP | 2011096406 A * | 5/2011 | | |
| JP | 2015-518287 | 6/2015 | | |
| JP | 2015-165494 A | 9/2015 | | |
| KR | 2010-0095504 A | 8/2010 | | |
| TW | 200935639 | 8/2009 | | |
| WO | WO-2009/069434 | 6/2009 | | |
| WO | WO-2015/118426 | 8/2015 | | |

OTHER PUBLICATIONS

Liao.S et al., "Hydroxynaphthyridine-derived group III metal chelates: wide band gap and deep blue analogues of green Alq3 (tris(8-hydroxyquinolate)aluminum) and their versatile applications for organic light-emitting diodes.", J. Am. Chem. Soc. (Journal of the American Chemical Society), 2009, vol. 131, No. 2, pp. 763-777.

International Search Report (Application No. PCT/IB2020/053071) Dated Jul. 14, 2020.

Written Opinion (Application No. PCT/IB2020/053071) Dated Jul. 14, 2020.

* cited by examiner

LIGHT-EMITTING DEVICE, LIGHT-EMITTING APPARATUS, LIGHT-EMITTING MODULE, ELECTRONIC DEVICE, AND LIGHTING DEVICE

CROSS REFERENCE TO RELATED APPLICATIONS

This application is a U.S. National Phase Application under 35 U.S.C. § 371 of International Application PCT/IB2020/053071, filed on Apr. 1, 2020, which is incorporated by reference and claims the benefit of a foreign priority application filed in Japan on Apr. 12, 2019, as Application No. 2019-076244.

TECHNICAL FIELD

One embodiment of the present invention relates to a light-emitting device (also referred to as a light-emitting element), a light-emitting apparatus, a light-emitting module, an electronic device, and a lighting device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

Research and development has been actively conducted on light-emitting devices using organic electroluminescence (EL) phenomenon (also referred to as organic EL devices or organic EL elements). In a basic structure of an organic EL device, a layer including a light-emitting organic compound (hereinafter also referred to as a light-emitting layer) is sandwiched between a pair of electrodes. By application of voltage to the organic EL device, light emitted from the light-emitting organic compound can be obtained.

Examples of the light-emitting organic compound are a compound capable of converting a singlet excited state into light emission (also referred to as a fluorescent compound or a fluorescent substance) and a compound capable of converting a triplet excited state into light emission (also referred to as a phosphorescent compound or a phosphorescent substance). An organometallic complex that contains iridium or the like as a central metal is disclosed as a phosphorescent compound in Patent Document 1.

An organic EL device is suitable for a display device because it has features such as ease of thinning and lightening, high-speed response to an input signal, and driving with a direct-current low voltage source.

An organic EL device can be formed in a film form and thus can provide planar light emission. Accordingly, a large-area light-emitting device can be easily formed. This feature is difficult to obtain with a point light source typified by an LED (light-emitting diode) or a linear light source typified by a fluorescent lamp. Thus, an organic EL device also has great potential as a planar light source applicable to a lighting device and the like.

REFERENCE

Patent Document

[Patent Document 1] Japanese Published Patent Application No. 2007-137872

SUMMARY OF THE INVENTION

Problems to be Solved by the Invention

An object of one embodiment of the present invention is to provide a light-emitting device with a long lifetime. Another object of one embodiment of the present invention is to provide a light-emitting device with high reliability. Another object of one embodiment of the present invention is to provide a light-emitting device with a low driving voltage. Another object of one embodiment of the present invention is to provide a light-emitting device with high emission efficiency.

Note that the description of these objects does not preclude the existence of other objects. One embodiment of the present invention does not need to achieve all these objects. Other objects can be derived from the description of the specification, the drawings, and the claims.

Means for Solving the Problems

A light-emitting device of one embodiment of the present invention is a light-emitting device including a first electrode, a first light-emitting layer, a first layer, a second layer, a third layer, a second light-emitting layer, and a second electrode stacked in this order. The first layer contains a first organic compound and a first substance. The second layer contains a second organic compound. The third layer contains a second substance. The first organic compound is an electron-transport material. The first substance is a metal, a metallic salt, a metal oxide, or an organometallic salt. The second organic compound is an electron-transport material. The second substance is an electron-injection material. The second layer has a lower concentration of the first substance than the first layer. It is particularly preferable that the second layer do not contain the first substance.

The first organic compound and the second organic compound are preferably the same organic compound.

The third layer preferably further contains a third organic compound. The third organic compound is preferably an electron-transport material. The third organic compound is preferably the same organic compound as at least one of the first organic compound and the second organic compound.

The first substance is preferably an organometallic complex including an alkali metal or an alkaline earth metal.

The first substance is preferably an organometallic complex including a ligand including nitrogen and oxygen, and an alkali metal or an alkaline earth metal.

The first substance is preferably an organometallic complex including a quinolinol ligand, and an alkali metal or an alkaline earth metal.

The second substance preferably includes an alkali metal, an alkaline earth metal, or a rare earth metal.

The first organic compound preferably has a HOMO level higher than or equal to −6.0 eV and an electron mobility higher than or equal to $1\times10^{-7}$ cm$^2$/Vs and lower than or equal to $5\times10^{-5}$ cm$^2$/Vs when the square root of electric field strength [V/cm] is 600.

The first layer preferably has a first region on the first light-emitting layer side and a second region on the second light-emitting layer side. The concentration ratio of the first organic compound to the first substance is preferably different between the first region and the second region. It is particularly preferable that the second region have a lower concentration of the first substance than the first region.

The light-emitting device of one embodiment of the present invention preferably further includes a hole-injection layer. The hole-injection layer is preferably positioned between the first electrode and the first light-emitting layer. The hole-injection layer preferably contains a first compound and a second compound. The first compound preferably has an electron-accepting property with respect to the second compound. The second compound preferably has a HOMO level higher than or equal to −5.7 eV and lower than or equal to −5.4 eV.

The light-emitting device of one embodiment of the present invention preferably further includes a first hole-transport layer. The first hole-transport layer is preferably positioned between the hole-injection layer and the first light-emitting layer. The first hole-transport layer preferably contains a third compound. A HOMO level of the third compound is preferably lower than or equal to the HOMO level of the second compound. A difference between the HOMO level of the third compound and the HOMO level of the second compound is preferably less than or equal to 0.2 eV. Each of the second compound and the third compound preferably includes at least one of a carbazole skeleton, a dibenzofuran skeleton, a dibenzothiophene skeleton, and an anthracene skeleton.

The light-emitting device of one embodiment of the present invention preferably further includes a second hole-transport layer. The second hole-transport layer is preferably positioned between the first hole-transport layer and the first light-emitting layer. The second hole-transport layer preferably contains a fourth compound. A HOMO level of the fourth compound is preferably lower than the HOMO level of the third compound. Each of the second compound, the third compound, and the fourth compound preferably includes at least one of a carbazole skeleton, a dibenzofuran skeleton, a dibenzothiophene skeleton, and an anthracene skeleton.

The first light-emitting layer preferably contains a light-emitting substance emitting blue light.

The first light-emitting layer preferably contains a fluorescent substance emitting blue light.

One embodiment of the present invention is a light-emitting apparatus that includes the light-emitting device having any of the above-described structures, and one or both of a transistor and a substrate.

One embodiment of the present invention is a light-emitting module including the above-described light-emitting apparatus, where a connector such as a flexible printed circuit (hereinafter referred to as FPC) or a TCP (Tape Carrier Package) is attached or an integrated circuit (IC) is mounted by a COG (Chip On Glass) method, a COF (Chip On Film) method, or the like. Note that the light-emitting module of one embodiment of the present invention may include only one of a connector and an IC or may include both of them.

One embodiment of the present invention is an electronic device including the above-described light-emitting module and at least one of an antenna, a battery, a housing, a camera, a speaker, a microphone, and an operation button.

One embodiment of the present invention is a lighting device including the light-emitting device having any of the above-described structures and at least one of a housing, a cover, and a support base.

Effect of the Invention

One embodiment of the present invention can provide a light-emitting device with a long lifetime. One embodiment of the present invention can provide a light-emitting device with high reliability. One embodiment of the present invention can provide a light-emitting device with a low driving voltage. One embodiment of the present invention can provide a light-emitting device with high emission efficiency.

Note that the description of these effects does not preclude the existence of other effects. One embodiment of the present invention does not need to have all these effects. Other effects can be derived from the description of the specification, the drawings, and the claims.

MODE FOR CARRYING OUT THE INVENTION

Figure 1A:
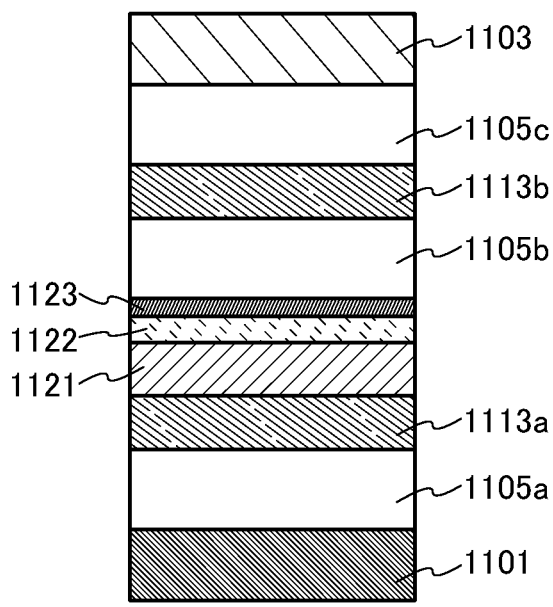
FIG. 1A to FIG. 1D are diagrams illustrating examples of light-emitting devices.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in the structures of the present invention described below, the same portions or portions having similar functions are denoted by the same reference numerals in different drawings, and description thereof is not repeated. Furthermore, the same hatch pattern is used for portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a light-emitting device of one embodiment of the present invention will be described with reference to FIG. 1 and FIG. 2.

The light-emitting device of one embodiment of the present invention includes a first electrode, a first light-emitting layer, a first layer, a second layer, a third layer, a second light-emitting layer, and a second electrode stacked in this order. The first layer contains a first organic compound and a first substance. The second layer contains a second organic compound. The third layer contains a second substance. Each of the first organic compound and the second organic compound is a material with a high electron-transport property (also referred to as an electron-transport material). The first substance is a metal, a metallic salt, a metal oxide, or an organometallic salt. The second substance is a material with a high electron-injection property (also referred to as an electron-injection material).

The light-emitting device of one embodiment of the present invention has a structure in which holes are likely to be injected into a first light-emitting layer and electrons are less likely to be injected into the first light-emitting layer. Holes are easily injected from the first electrode side and the amount of electrons injected into the light-emitting layer from the second electrode side is suppressed, whereby the light-emitting layer can be inhibited from having excess electrons. Moreover, injection of electrons into the light-emitting layer accelerates with time, thereby increasing luminance, and the increase in luminance can cancel out initial decay. Using a light-emitting device with little initial decay and an extremely long driving lifetime can increase the reliability.

Here, in the case where the first layer containing the first substance (a metal, a metallic salt, a metal oxide, or an organometallic salt) and the third layer containing the second substance (the electron-injection material) are provided in contact with each other, characteristics of the light-emitting device might become worse, for example, the driving voltage might increase.

Thus, in the light-emitting device of one embodiment of the present invention, a second layer is provided between the first layer and the third layer. The second layer contains the second organic compound (an electron-transport material). The second layer has a feature in that the concentration of the first substance is lower than that in the first layer. The use of such the second layer can improve the characteristics of the light-emitting device. Specifically, in the light-emitting device, an increase in driving voltage can be suppressed, the driving lifetime can be prolonged, and the reliability can be increased.

It is particularly preferable that the second layer do not contain the first substance. That is, in this specification and the like, the case where the second layer has a lower concentration of the first substance than the first layer includes a structure in which the second layer does not contain the first substance.

The light-emitting device of one embodiment of the present invention has a tandem structure in which a plurality of light-emitting units are stacked. Specifically, the light-emitting device of one embodiment of the present invention includes at least two light-emitting units, which are a light-emitting unit including the first light-emitting layer and a light-emitting unit including the second light-emitting layer. The light-emitting device with a tandem structure has higher current efficiency and a smaller amount of current for emitting light with the same luminance than the light-emitting device with a single structure. Thus, the lifetime of the light-emitting device can be prolonged and the reliability can be increased.

In the case where a display device is manufactured with the light-emitting device, a light-emitting device with a tandem structure, which includes a common light-emitting layer to subpixels for different colors, is provided and combined with at least one of a color filter, a color conversion layer, and a micro optical resonator (microcavity) structure, whereby a display device capable of full-color display can be manufactured.

In the case where different light-emitting layers are formed by evaporation in the subpixels for different colors, high accuracy of placing an opening of a metal mask in a desired position (also referred to as alignment accuracy) is required. In particular, a high-definition display device has a high pixel density and thus needs extremely high alignment accuracy. In addition, a film is formed in a wider range than a desired region owing to bending of the metal mask, there is a difficulty in manufacture on a large-sized substrate.

In contrast, in the case where a display device capable of full-color display is manufactured with the light-emitting device of one embodiment of the present invention, a step of forming different light-emitting layers in the subpixels for different colors by evaporation is not needed. Thus, a high-definition display device or large display device can be manufactured with high productivity.

[Structure of Light-Emitting Device]

FIG. 1A to FIG. 1D illustrate light-emitting devices of embodiments of the present invention.

The light-emitting device illustrated in FIG. 1A includes a first electrode 1101, a functional layer 1105a, a light-emitting layer 1113a, a first layer 1121, a second layer 1122, a third layer 1123, a functional layer 1105b, a light-emitting layer 1113b, a functional layer 1105c, and a second electrode 1103.

Note that in this specification and the like, a plurality of layers provided between a pair of electrodes (the first electrode 1101 and the second electrode 1103) (in FIG. 1A, the functional layer 1105a, the light-emitting layer 1113a, the first layer 1121, the second layer 1122, the third layer 1123, the functional layer 1105b, the light-emitting layer 1113b, and the functional layer 1105c) are collectively referred to as an EL layer in some cases.

In this embodiment, the case where the first electrode 1101 functions as an anode and the second electrode 1103 functions as a cathode is described as an example. In the case where the first electrode functions as a cathode and the second electrode 1103 functions as an anode, the stacking order of the EL layer is reversed.

As each of the functional layer 1105a, the functional layer 1105b, and the functional layer 1105c, at least one of a hole-injection layer, a hole-transport layer, an electron-transport layer, an electron-injection layer, a hole-blocking layer, an electron-blocking layer, a charge-generation layer, and the like can be used.

The light-emitting device illustrated in FIG. 1A has a tandem structure which includes a light-emitting unit including the light-emitting layer 1113a and a light-emitting unit including the light-emitting layer 1113b. A charge generation region exists between the two light-emitting units. The charge generation region has a function of injecting electrons into one of the two light-emitting units and injecting holes into the other when voltage is applied between the first electrode 1101 and the second electrode 1103. Thus, in FIG. 1A, when voltage is applied such that the potential of the first electrode 1101 is higher than that of the second electrode 1103, electrons are injected into the light-emitting unit including the light-emitting layer 1113a from the charge generation region, and holes are injected to the light-emitting unit including the light-emitting layer 1113b.

Each of the light-emitting layer 1113a and the light-emitting layer 1113b contains a light-emitting substance and a plurality of organic compounds in appropriate combination, whereby fluorescence or phosphorescence with a desired wavelength can be obtained. The light-emitting layer 1113a and the light-emitting layer 1113b may emit light of the same color or may emit light of different colors. Materials which can be used for the light-emitting layers will be described later.

<First Layer>

The first layer 1121 contains the first organic compound and the first substance.

The first organic compound is an electron-transport material. The electron-transport material has an electron-transport property higher than a hole-transport property.

The highest occupied molecular orbital level (HOMO level) of the first organic compound is preferably greater than or equal to −6.0 eV.

The electron mobility of the first organic compound is preferably higher than or equal to $1\times10^{-7}$ cm$^2$/Vs and lower than or equal to $1\times10^{-5}$ cm$^2$/Vs, further preferably higher than or equal to $1\times10^{-7}$ cm$^2$/Vs and lower than or equal to $5\times10^{-5}$ cm$^2$ when the square root of electric field strength [V/cm] is 600.

The electron mobility in the first organic compound when the square root of the electric field strength [V/cm] is 600 is preferably smaller than that in the host material of the light-emitting layer 1113a. The amount of electrons injected into the light-emitting layer 1113a can be controlled by the reduction in the electron-transport property of the first layer 1121, whereby the light-emitting layer 1113a can be prevented from having excess electrons.

The first organic compound preferably has an anthracene skeleton, and further preferably has an anthracene skeleton and a heterocyclic skeleton. The heterocyclic skeleton is preferably a nitrogen-containing five-membered ring skeleton. It is particularly preferable that the nitrogen-containing five-membered ring skeleton include two heteroatoms in a ring, like a pyrazol ring, an imidazole ring, an oxazole ring, or, a thiazole ring.

Examples of the first organic compound include 2-{4-[9,10-di(naphthalen-2-yl)-2-anthryl]phenyl}-1-phenyl-1H-benzimidazole (abbreviation: ZADN), 9-(1-naphthyl)-10-[4-(2-naphthyl)phenyl]anthracene (abbreviation: αN-βNPAnth), 9-[4-(10-phenyl-9-anthracenyl)phenyl]-9H-carbazole (abbreviation: CzPA), and 7-[4-(10-phenyl-9-anthryl)phenyl]-7H-dibenzo[c,g]carbazole (abbreviation: cgDBCzPA).

Other examples of the first organic compound include the electron-transport materials that can be used in the light-emitting layer to be described later and the organic compounds (host materials) that can be used in combination with the fluorescent material.

The first substance is a metal, a metallic salt, a metal oxide, or an organometallic salt.

Examples of the metal include an alkali metal, an alkaline earth metal, and a rare earth metal. Specific examples include Li, Na, K, Rb, Cs, Mg, Ca, Sr, and Ba.

Examples of the metallic salt include halides of the above metals and carbonates of the above metals. Specific examples include LiF, NaF, KF, RbF, CsF, MgF$_2$, CaF$_2$, SrF$_2$, BaF$_2$, LiCl, NaCl, KCl, RbCl, CsCl, MgCl$_2$, CaCl$_2$, SrCl$_2$, BaCl$_2$, Li$_2$CO$_3$, and Cs$_2$CO$_3$.

Examples of the metal oxide are oxides of the above metals. Specific examples include Li$_2$O, Na$_2$O, Cs$_2$O, MgO, and CaO.

Examples of the organometallic salt are organometallic complexes.

The first substance is preferably an organometallic complex containing an alkali metal or an alkaline earth metal.

The first substance is preferably an organometallic complex including a ligand containing nitrogen and oxygen, and an alkali metal or an alkaline earth metal.

The first substance is preferably an organometallic complex including a quinolinol ligand, and an alkali metal or an alkaline earth metal.

Examples of the organometallic complex include 8-(quinolinolato)lithium (abbreviation: Liq), 8-(quinolinolato)sodium (abbreviation: Naq), 8-(quinolinolato)potassium (abbreviation: Kq), (8-quinolinolato)magnesium (abbreviation: Mgq$_2$), and (8-quinolinolato)zinc (abbreviation: Znq$_2$).

As the first substance, Liq is particularly preferable.

The first layer 1121 may have a first region on the light-emitting layer 1113a side and a second region on the light-emitting layer 1113b side. The first region and the second region preferably have different concentration ratios of the first organic compound to the first substance. For example, the second region preferably has a lower concentration of the first substance than the first region.

<Second Layer>

The second layer 1122 contains the second organic compound.

The second organic compound is an electron-transport material. Materials that can be used as the second organic compound are the same as the materials that can be used as the first organic compound.

The first organic compound and the second organic compound may be the same organic compound or different organic compounds.

The second layer preferably has a lower concentration of the first substance than the first layer. In particular, it is preferable that the second layer do not contain the first substance.

When the second layer 1122 is provided between the first layer 1121 and the third layer 1123, the injection property of electrons from the third layer 1123 to the second layer 1122, and furthermore, to the first layer 1121 is increased, whereby the driving voltage of the light-emitting device can be reduced.

In the structure in which the first layer 1121 and the third layer 1123 are in contact with each other, the second substance (or a metal contained in the second substance) is less likely to be diffused into the first layer 1121 in some cases. When the second layer 1122 is provided between the first layer 1121 and the third layer 1123, the second substance (or a metal contained in the second substance) contained in the third layer 1123 is likely to be diffused into the second layer 1122, which can decrease the driving voltage of the light-emitting device. As a result, the reliability of the light-emitting device can be increased.

<Third Layer>

The third layer 1123 contains the second substance.

The second substance is an electron-injection material.

As the electron-injection material, an alkali metal, an alkaline earth metal, a rare earth metal, or a compound thereof can be used. Examples of the alkali metal, the alkaline earth metal, and the rare earth metal include lithium, cesium, magnesium, calcium, erbium, and ytterbium. Examples of the compound of the above include an alkali metal compound, an alkaline earth metal compound, and a rare earth metal compound. Examples of the compound of the above include a metal oxide and a metallic salt. Specifically, a metal oxide such as lithium oxide ($Li_2O$) and carbonate such as lithium carbonate ($Li_2CO_3$) or cesium carbonate ($Cs_2CO_3$) are given as examples. As the electron-injection material, electride may be used. An example of the electride is a substance in which electrons are added at high concentration to a mixed oxide of calcium and aluminum.

The third layer 1123 may further contain a third organic compound. In this case, the second substance preferably exhibits an electron-donating property (donor property) with respect to the third organic compound.

The third organic compound is an electron-transport material. Materials that can be used as the third organic compound are the same as the materials that can be used as the first organic compound.

The third organic compound and the first organic compound may be the same organic compound or different organic compounds. Similarly, the third organic compound and the second organic compound may be the same organic compound or different organic compounds.

Figure 1B:
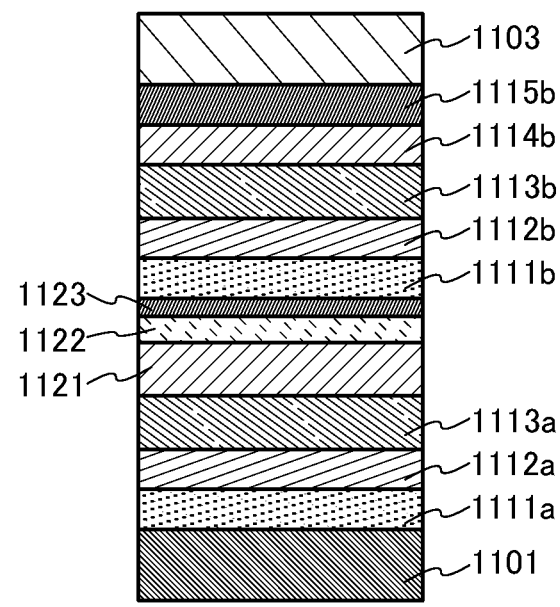
Figure 1C:
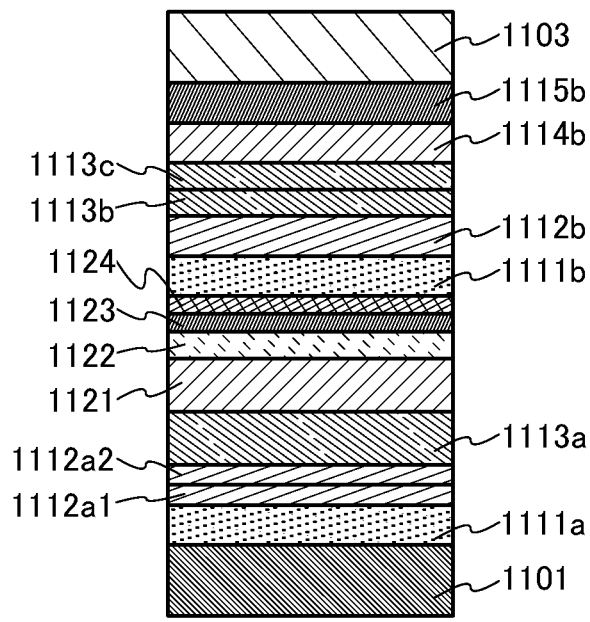

Each of FIG. 1B and FIG. 1C is a specific example of the functional layer 1105a, the functional layer 1105b, and the functional layer 1105c in FIG. 1A.

The light-emitting device illustrated in FIG. 1B includes the first electrode 1101, a hole-injection layer 1111a, a hole-transport layer 1112a, the light-emitting layer 1113a, the first layer 1121, the second layer 1122, the third layer 1123, a hole-injection layer 1111b, a hole-transport layer 1112b, a light-emitting layer 1113b, an electron-transport layer 1114b, an electron-injection layer 1115b, and the second electrode 1103.

The hole-injection layer 1111a preferably contains a first compound and a second compound.

The first compound is an electron-accepting material (an acceptor material) and has a property of accepting electrons from the second compound.

The second compound is a hole-transport material. The hole-transport material has a hole-transport property higher than an electron-transport property.

The highest occupied molecular orbital level (HOMO level) of the second compound is preferably relatively low (deep). Specifically, the HOMO level of the second compound is preferably higher than or equal to −5.7 eV and lower than or equal to −5.4 eV. A relatively low HOMO level of the second compound is preferable because hole injection into the hole-transport layer 1112a can be easily performed.

As the first compound, an organic compound including an electron-withdrawing group (particularly a cyano group or a halogen group such as a fluoro group) can be used.

As the first compound, organic acceptors such as a quinodimethane derivative, a chloranil derivative, and a hexaazatriphenylene derivative can be used, for example. Specifically, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylen-1,3,4,5,6,8,9,10-octafluoro-7H-pyren-2-ylidene)malononitrile can be given. A compound in which electron-withdrawing groups are bonded to a condensed aromatic ring having a plurality of heteroatoms, such as HAT-CN, is preferable because it is thermally stable. Alternatively, a [3]radialene derivative including an electron-withdrawing group (in particular, a cyano group or a halogen group such as a fluoro group) is preferable because it has a very high electron-accepting property. Examples of the [3]radialene derivative including an electron-withdrawing group include α,α',α''-1,2,3-cyclopropanetriylidenetris [4-cyano-2,3,5,6-tetrafluorobenzeneacetonitrile], α,α',α''-1, 2,3-cyclopropanetriylidenetris[2,6-dichloro-3,5-difluoro-4-(trifluoromethyl)benzeneacetonitrile], and α,α',α''-1,2,3-cyclopropanetriylidenetris [2,3,4,5,6-pentafluorobenzeneacetonitrile].

The second compound preferably has a hole-transport skeleton. A carbazole skeleton, a dibenzofuran skeleton, a dibenzothiophene skeleton, and an anthracene skeleton, with which the HOMO levels of the hole-transport materials do not become too high (shallow), are preferably used as the hole-transport skeleton.

The second compound preferably includes at least one of a carbazole skeleton, a dibenzofuran skeleton, a dibenzothiophene skeleton, and an anthracene skeleton. The hole-transport material may be an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of the amine through an arylene group.

The second compound including an N,N-bis(4-biphenyl) amino group is preferred because a light-emitting device having a long lifetime can be manufactured.

Examples of the second compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4''-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4''-diphenyltriphenylamine (abbreviation: BBAβNB), 4-[4-(2-naphthyl)phenyl]-4',4''-diphenyltriphenylamine (abbreviation: BBAβNBi), 4,4'-diphenyl-4''-(6;1'-binaphthyl-2-yl)tri phenyl amine (abbreviation: BBAαNβNB), 4,4'-diphenyl-4''-(7;1'-binaphthyl-2-yl)triphenylamine (abbreviation: BBAαNβNB-03), 4,4'-diphenyl-4''-(7-phenyl)naphthyl-2-yl)triphenylamine (abbreviation: BBAPβNB-03), 4,4'-diphenyl-4''-(6;2'-binaphthyl-2-yl)triphenylamine (abbreviation: BBA(βN2)B), 4,4'-diphenyl-4''-(7;2'-binaphthyl-2-yl)triphenylamine (abbreviation: BBA(βN2)B-03), 4,4'-diphenyl-4''-(4;2'-binaphthyl-1-yl)tri phenyl amine (abbreviation: BBAβNαNB), 4,4'-diphenyl-4''-(5;2'-binaphthyl-1-yl)tri phenyl amine (abbreviation: BBAβNαNB-02), 4-(4-biphenylyl)-4'-(2-naphthyl)-4''-phenyltriphenylamine (abbreviation: TPBiAβNB), 4-(3-biphenylyl)-4'-[4-(2-naphthyl)phenyl]-4''-phenyltriphenylamine (abbreviation: mTPBiAβNBi), 4-(4-biphenylyl)-4'-[4-(2-naphthyl)phenyl]-4''-phenyltriphenylamine (abbreviation: TPBiAβNBi), 4-phenyl-4'-(1-naphthyl)triphenyl amine (abbreviation: αNBA1BP), 4,4'-bis(1-naphthyl)triphenylamine (abbreviation: αNBB1BP), 4,4'-diphenyl-4''-[4'-(carbazol-9-yl)biphenyl-4-yl]triphenylamine (abbreviation: YGTBi1BP), 4'-[4-(3-phenyl-9H-carbazol-9-yl)phenyl]tris (1,1'-biphenyl-4-yl)amine (abbreviation: YGTBi1BP-02), 4-[4'-(carbazol-9-yl)biphenyl-4-yl]-4'-(2-naphthyl)-4''-phenyltriphenylamine (abbreviation: YGTBiβNB), N-[4-(9-phenyl-9H-carbazol-3-yl)phenyl]-N-[4-(1-naphthyl)phenyl]-9,9'-spirobi(9H-fluoren)-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi(9H-fluoren)-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-9,9-dimethyl-N-[4-(9-phenyl-9H-carbazol-3-yl)phenyl]-9H-fluoren-2-amine (abbreviation: PCBBiF), 3,3'-(naphthalen-1,4-diyl)bis(9-phenyl-9H-carbazole) (abbreviation: PCzN2), and 4-(10-phenyl-9-anthryl)-4'-(9-phenyl-9H-fluoren-9-yl)triphenylamine (abbreviation: FLPAPA).

The hole-transport layer 1112a illustrated in FIG. 1B is a layer that transports holes, which are injected by the hole-injection layer 1111a, to the light-emitting layer 1113a.

The hole-transport layer 1112a preferably contains a third compound.

The third compound is a hole-transport material. As the hole-transport material, a hole-transport material that can be used as the second compound can be used.

The HOMO level of the third compound is preferably lower than or equal to the HOMO level of the second compound. A difference between the HOMO level of the third compound and the HOMO level of the second compound is preferably less than or equal to 0.2 eV.

Each of the second compound and the third compound preferably includes at least one of a carbazole skeleton, a dibenzofuran skeleton, a dibenzothiophene skeleton, and an anthracene skeleton.

It is preferable that the second compound and the third compound have the same hole-transport skeleton (especially a dibenzofuran skeleton), in which case holes can be injected smoothly.

It is further preferable that the second compound and the third compound be the same, in which case holes can be injected smoothly.

The hole-injection layer 1111b has a function of facilitating injection of holes to the hole-transport layer 1112b.

The hole-injection layer 1111b may contain the first compound and the second compound. Furthermore, a material having a high hole-injection property (a hole-injection material) to be described later may also be contained.

The hole-transport layer 1112b is a layer that transports holes injected by the hole-injection layer 1111b, to the light-emitting layer 1113b.

The hole-transport layer 1112b preferably contains a hole-transport material. As the hole-transport material, a hole-transport material that can be used as the second compound can be used. Another hole-transport material to be described later may be contained.

The electron-transport layer 1114b is a layer that transports electrons injected from the electron-injection layer 1115b, to the light-emitting layer 1113b.

The electron-transport layer 1114b preferably contains an electron-transport material. As the electron-transport material, an electron-transport material that can be used as the first organic compound can be used.

The electron-injection layer 1115b has a function of facilitating injection of electrons to the EL layer. The difference between the work function value of the material used for the second electrode 1103 and the lowest unoccupied molecular orbital level (LUMO level) of the material used for the electron-injection layer 1115b is preferably small (within 0.5 eV).

The electron-injection layer 1115b preferably contains an electron-injection material. As the electron-injection material, an electron-injection material that can be used as the second substance can be used. For the electron-injection layer 1115b, a composite material containing an electron-transport material and an electron-donating material (donor material), which is to be described later, can be used.

The light-emitting device illustrated in FIG. 1C is different from the light-emitting device illustrated in FIG. 1B in that the hole-transport layer 1112a has a stacked structure of a hole-transport layer 1112a1 and a hole-transport layer 1112a2, that a fourth layer 1124 is included between the third layer 1123 and the hole-injection layer 1111b, and that a light-emitting layer 1113*c* is included between the light-emitting layer 1113*b* and the electron-transport layer 1114*b*.

The hole-transport layer 1112*a*1 and the hole-transport layer 1112*a*2 are layers that transport holes to the light-emitting layer 1113*a* side.

The hole-transport layer 1112*a*1 preferably contains a third compound.

The third compound is a hole-transport material. As the hole-transport material, a hole-transport material that can be used as the second compound can be used.

The HOMO level of the third compound is preferably lower than or equal to the HOMO level of the second compound. A difference between the HOMO level of the third compound and the HOMO level of the second compound is preferably less than or equal to 0.2 eV.

It is further preferable that the second compound and the third compound be the same, in which case holes can be injected smoothly.

The hole-transport layer 1112*a*1 can have the same structure as the hole-transport layer 1112*a* in FIG. 1B.

The hole-transport layer 1112*a*2 preferably contains a fourth compound. The hole-transport layer 1112*a*2 preferably has a function as an electron-blocking layer.

The fourth compound is a hole-transport material. As the hole-transport material, a hole-transport material that can be used as the second compound can be used.

The HOMO level of the fourth compound is preferably lower than the HOMO level of the third compound. A difference between the HOMO level of the fourth compound and the HOMO level of the third compound is preferably less than or equal to 0.2 eV.

Each of the second compound, the third compound, and the fourth compound preferably includes at least one of a carbazole skeleton, a dibenzofuran skeleton, a dibenzothiophene skeleton, and an anthracene skeleton.

It is preferable that the second compound, the third compound, and the fourth compound have the same hole-transport skeleton (especially a dibenzofuran skeleton), in which case holes can be injected smoothly.

Owing to the above-described relation of the hole-transport materials used for the hole-injection layer 1111*a*, the hole-transport layer 1112*a*1, and the hole-transport layer 1112*a*2, holes can be injected into each layer smoothly, which can prevent an increase in driving voltage and deficiency of holes in the light-emitting layer 1113*a*.

The fourth layer 1124 preferably contains an electron-transport material. Providing the fourth layer 1124 can suppress interaction between the third layer 1123 and the hole-injection layer 1111*b*, whereby electrons can be smoothly transferred.

The LUMO level of the electron-transport material contained in the fourth layer 1124 is preferably between the LUMO level of an electron-accepting material contained in the hole-injection layer 1111*b* and the LUMO level of the second substance contained in the third layer 1123. A specific energy level of the LUMO level of the electron-transport material used for the fourth layer 1124 is preferably higher than or equal to −5.0 eV, further preferably higher than or equal to −5.0 eV and lower than or equal to −3.0 eV. Examples of the electron-transport material used for the fourth layer 1124 include a phthalocyanine-based material such as phthalocyanine (abbreviation: $H_2Pc$) or copper phthalocyanine (abbreviation: CuPc) and a metal complex having a metal-oxygen bond and an aromatic ligand.

The light-emitting device illustrated in FIG. 1C includes two light-emitting units, which are a light-emitting unit including the light-emitting layer 1113*a* and a light-emitting unit including the light-emitting layer 1113*b* and the light-emitting layer 1113*c*. For example, the light-emitting layer 1113*a* emits blue fluorescence, the light-emitting layer 1113*b* emits green phosphorescence, and the light-emitting layer 1113*c* emits red phosphorescence, whereby the light-emitting device can emit white light as a whole.

Figure 1D:
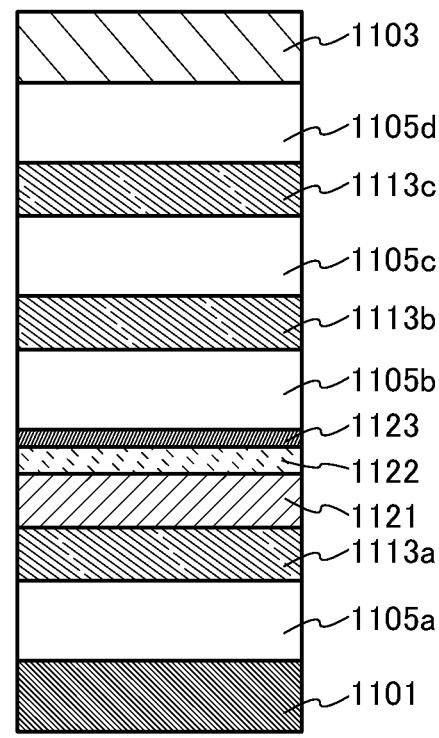

The light-emitting device illustrated in FIG. 1D includes the light-emitting layer 1113*c* and a functional layer 1105*d* between the functional layer 1105*c* and the second electrode 1103 in addition to the components of the light-emitting device illustrated in FIG. 1A.

The number of light-emitting units included in the light-emitting device is not limited to two. The light-emitting device illustrated in FIG. 1D is an example that includes three light-emitting units, which are a light-emitting unit including the light-emitting layer 1113*a*, a light-emitting unit including the light-emitting layer 1113*b*, and a light-emitting unit including the light-emitting layer 1113*c*. For example, in the structure of FIG. 1D, when the light-emitting layer 1113*a* emits first blue light, the light-emitting layer 1113*b* emits green light, yellow light, or yellowish green light and red light, and the light-emitting layer 1113*c* emits second blue light, the light-emitting device can emit white light as a whole.

The functional layer 1105*c* includes at least one of an electron-transport layer, an electron-injection layer, a charge-generation layer, a hole-injection layer, and a hole-transport layer. The functional layer 1105*c* has a charge generation region.

The functional layer 1105*d* may include, for example, an electron-transport layer and an electron-injection layer.

[Light Emission Model in Light-Emitting Device]

A light emission model of the light-emitting device of one embodiment of the present invention will be described.

Here, a light emission model of a light-emitting device is described using the hole-transport layer 1112*a*, the light-emitting layer 1113*a*, and the first layer 1121 in FIG. 1B. The structure of the light-emitting device is not limited is not limited to FIG. 1B, and the light emission model can also be applied to another structure.

When the light-emitting layer 1113*a* has excess electrons, a light-emitting region is formed in a limited region of the light-emitting layer 1113*a*. In other words, the width of the light-emitting region in the light-emitting layer 1113*a* is narrow. Thus, electrons and holes are recombined intensively in the limited region of the light-emitting layer 1113*a*, which accelerates degradation. In addition, the lifetime or emission efficiency may be reduced when electrons that have not been recombined in the light-emitting layer 1113*a* pass through the light-emitting layer 1113*a*.

Meanwhile, in the light-emitting device of one embodiment of the present invention, the width of the light-emitting region in the light-emitting layer 1113*a* can be increased by lowering the electron-transport property of the first layer 1121. Increasing the width of the light-emitting region enables the recombination region between electrons and holes in the light-emitting layer 1113*a* to be dispersed. Accordingly, a light-emitting device with a long lifetime and favorable emission efficiency can be provided.

The luminance decay curve of the light-emitting device of one embodiment of the present invention, which is obtained by a driving test at a constant current density, sometimes has the local maximum. In other words, the light-emitting device of one embodiment of the present invention sometimes shows a behavior such that the luminance increases with time. This behavior can cancel out rapid degradation at the initial driving stage (i.e., initial decay). Thus, the light-emitting device having the structure showing the behavior can have a small initial decay and an extremely long driving lifetime.

Note that a differential value of the decay curve having the local maximum is 0 in a part. Therefore, a light-emitting device having a decay curve whose differential value is 0 in a part can be referred to as the light-emitting device of one embodiment of the present invention.

In the light-emitting device of one embodiment of the present invention, the light-emitting region sometimes extends to the first layer 1121 side at the initial driving stage. That is, in the light-emitting device of one embodiment of the present invention, a hole injection barrier is small at the initial driving stage and the electron-transport property of the first layer 1121 is relatively low; accordingly, the light-emitting region (i.e., recombination region) is formed in the whole of the light-emitting layer 1113a in some cases.

The HOMO level of the first organic compound contained in the first layer 1121 is relatively high, which is greater than or equal to −6.0 eV, and thus some holes reach the first layer 1121 and recombination also occurs in the first layer 1121 in some cases. Note that this phenomenon sometimes occurs when the difference in the HOMO level between the host material (or the assist material) contained in the light-emitting layer 1113a and the first organic compound is less than or equal to 0.2 eV.

In the light-emitting device of one embodiment of the present invention, the carrier balance changes with time and recombination in the first layer 1121 is less likely to occur, whereby energy of recombined carriers can effectively contribute to light emission. Accordingly, the luminance may increase compared to that at the initial driving stage. This luminance increase cancels out the rapid luminance reduction at the initial driving stage of the light-emitting device, which is known as the initial decay. Thus, the light-emitting device can have a long driving lifetime with a small initial decay. Note that in this specification and the like, the structure of the above-described light-emitting device may be referred to as a Recombination-Site Tailoring Injection structure (ReSTI structure).

In the light-emitting device of one embodiment of the present invention, the first layer 1121 preferably has a region where the mix ratio (concentrations) of the first organic compound and the first substance in the first layer 1121 varies in the thickness direction. Specifically, the first layer 1121 preferably has a region where the mix ratio (concentrations) of the electron-transport material and an organometallic complex of an alkali metal or an alkaline earth metal varies.

The concentration of the first substance in the first layer 1121 can be estimated from the amount of atoms and molecules detected by time-of-flight secondary ion mass spectrometry (ToF-SIMS). In portions that contain the same two kinds of materials with different mixing ratios, values measured by ToF-SIMS analysis correspond to the amounts of target atoms or molecules. Therefore, comparing the detected amounts of the electron-transport material and the organometallic complex allows estimation of their mixing ratio.

The amount of the first substance in the first layer 1121 is preferably smaller on the second electrode 1103 side than on the first electrode 1101 side. In other words, the first layer 1121 is preferably formed to contain the first substance such that its concentration increases from the second electrode 1103 side to the first electrode 1101 side. That is, the first layer 1121 has a portion with a low concentration of the first organic compound on the light-emitting layer 1113a side than a portion with a high concentration of the first organic compound. In other words, in the first layer 1121, a portion with a high concentration of the first substance is positioned closer to the light-emitting layer 1113a than a portion with a low concentration of the first substance is.

In the first layer 1121, the electron mobility of the portion with a high concentration of the first organic compound (the portion with a low concentration of the first substance) is preferably higher than or equal to $1 \times 10^{-7}$ cm$^2$/Vs and lower than or equal to $5 \times 10^{-5}$ cm$^2$/Vs when the square root of the electric field strength [V/cm] is 600.

Figure 2A:
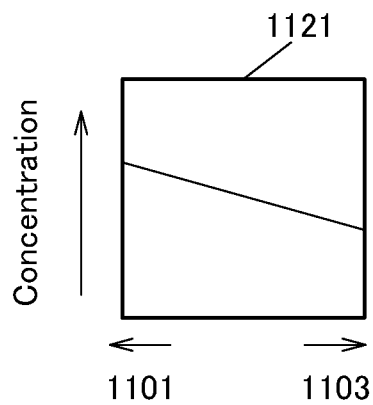
FIG. 2A to FIG. 2D are graphs explaining the concentration of a first substance in a first layer.
Figure 2B:
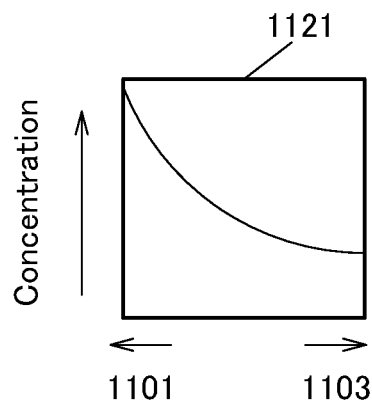
Figure 2C:
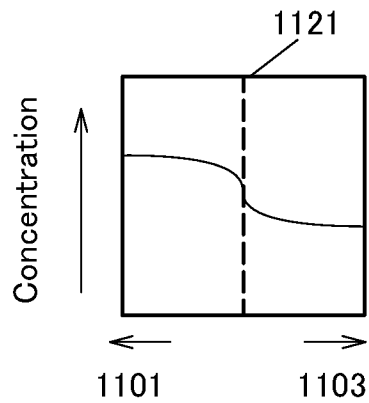
Figure 2D:
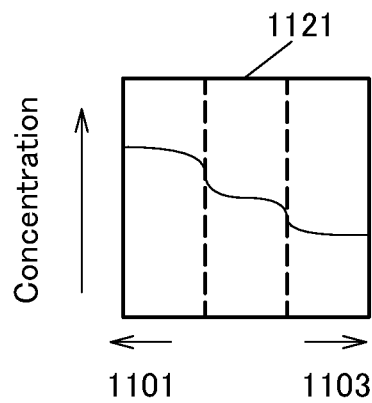

For example, the amount (concentration) of the first substance in the first layer 1121 can be as shown in each of FIG. 2A to FIG. 2D. FIG. 2A and FIG. 2B show the case where no clear boundary exists in the first layer 1121, and FIG. 2C and FIG. 2D show the case where a clear boundary exists in the first layer 1121.

In the case where a clear boundary does not exist in the first layer 1121, the concentrations of the first organic compound and the first substance continuously change. FIG. 2A and FIG. 2B show examples of continuous changes in the concentration of the first substance. In the case where a clear boundary exists in the first layer 1121, the concentrations of the first organic compound and the first substance change in a stepwise manner. FIG. 2C and FIG. 2D show examples of stepwise changes in the concentration of the first substance. Note that the case where the concentrations of the first organic compound and the first substance change in a stepwise manner suggests that the first layer 1121 is formed of a plurality of layers. For example, FIG. 2C shows the case where the first layer 1121 has a stacked structure of two layers, and FIG. 2D shows the case where the first layer 1121 has a stacked structure of three layers. Note that in FIG. 2C and FIG. 2D, a dashed line indicates a boundary region between a plurality of layers.

In the case where the second layer 1122 contains the first substance, the concentration of the first substance in the second layer is preferably lower than that in the first layer as described above.

Figure 2E:
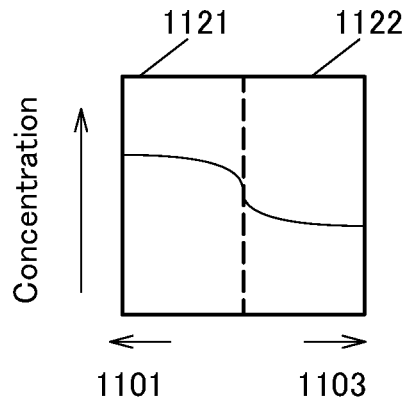
FIG. 2E and FIG. 2F are graphs explaining the concentration of the first substance in the first layer and a second layer.
Figure 2F:
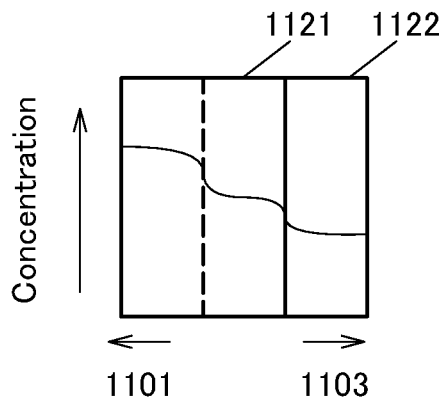

For example, the content amount (concentration) of the first substance in the first layer 1121 and the second layer 1122 can be the one shown in FIG. 2E and FIG. 2F.

For example, the concentration of the first substance changes in a stepwise manner as shown in FIG. 2E and FIG. 2F. FIG. 2E shows the case where the first layer 1121 has a single layer structure, and FIG. 2F shows the case where the first layer 1121 has a stacked structure of two layers.

A change in carrier balance in the light-emitting device of one embodiment of the present invention is probably caused by a change in electron mobility of the first layer 1121 (and the second layer 1122).

In the light-emitting device of one embodiment of the present invention, the concentration of the first substance varies in the first layer 1121. The first layer 1121 has a region with a high concentration of the first substance between a region with a low concentration of the first substance and the light-emitting layer 1113a. That is, the region with a low concentration of the first substance is closer to the second electrode 1103 than the region with a high concentration of the first substance is.

Alternatively, in the light-emitting device of one embodiment of the present invention, the concentration of the first substance differs between the first layer 1121 and the second layer 1122. The light-emitting device includes, between the second layer 1122 and the light-emitting layer 1113a, the first layer 1121 that has a higher concentration of the first substance than the second layer 1122. That is, the region with a low concentration of the first substance is closer to the second electrode 1103 than the region with a high concentration of the first substance is.

The light-emitting device of one embodiment of the present invention having the above structure has an extremely long lifetime. In particular, the time it takes for the luminance to decrease to 95% given that the initial luminance is 100% (the time can be referred to as LT95) can be extremely long.

[Material of Light-Receiving Device]

Materials that can be used in the light-emitting device will be described in detail below. Note that materials suitably used for the functional layer 1105*a* (the hole-injection layer 1111*a*, the hole-transport layer 1112*a*), the first layer 1121, the second layer 1122, the third layer 1123, and the fourth layer 1124 are as described above, but materials described below may be used.

<Electrode>

As a material that forms the pair of electrodes of the light-emitting device, a metal, an alloy, an electrically conductive compound, a mixture thereof, and the like can be used as appropriate. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

The light-emitting device of one embodiment of the present invention preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light emission obtained from the light-emitting layer can be resonated between the electrodes, whereby light emitted from the light-emitting device can be intensified.

Note that the transflective electrode can have a stacked-layer structure of an electrode having a property of transmitting visible light (also referred to as a transparent electrode) and a reflective electrode.

The transparent electrode has a visible light transmittance of higher than or equal to 40%. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%.

The resistivity of each of the first electrode 1101 and the second electrode 1103 is preferably less than or equal to $1 \times 10^{-2}$ Ωcm.

The first electrode 1101 and the second electrode 1103 can be formed by a sputtering method or a vacuum evaporation method.

<Hole-Injection Layer and Hole-Transport Layer>

The hole-injection layer has a function of facilitating injection of holes to the EL layer. For example, the hole-injection layer can have a function of injecting holes injected from the anode to the hole-transport layer (or the light-emitting layer). For example, the hole-injection layer can have a function of generating holes and injecting the holes to the hole-transport layer (or the light-emitting layer, for example).

For the hole-injection layer, a material having a high hole-injection property (hole-injection material) can be used.

For the hole-injection layer, a composite material containing a material having a high hole-transport property (hole-transport material) and an electron-accepting material can also be used. In this case, the electron-accepting material extracts electrons from the hole-transport material, so that holes are generated in the hole-injection layer and the holes are injected into the light-emitting layer through the hole-transport layer. Note that the hole-injection layer may be formed using a single layer of a composite material containing a hole-transport material and an electron-accepting material, or may be formed using a stack including a layer of a hole-transport material and a layer of an electron-accepting material.

The hole-transport layer is a layer that transports holes to the light-emitting layer.

For the hole-transport layer, the hole-transport material can be used. It is preferable that the HOMO level of the hole-transport material used for the hole-transport layer be the same as or close to the HOMO level of the hole-injection layer.

As the hole-injection material, a transition metal oxide such as, molybdenum oxide, vanadium oxide, ruthenium oxide, tungsten oxide, or manganese oxide, or a phthalocyanine-based compound, such as $H_2Pc$ or CuPC, can be used, for example.

As the hole-injection material, it is possible to use, for example, an aromatic amine compound such as 4,4',4"-tris (N,N-diphenylamino)triphenylamine (abbreviation: TDATA), 4,4',4"-tris[N-(3-methylphenyl)-N-phenylamino] triphenylamine (abbreviation: MTDATA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1).

As the hole-injection material, it is possible to use, for example, poly(N-vinylcarbazole) (abbreviation: PVK), poly (4-vinyltriphenylamine) (abbreviation: PVTPA), poly [N-(4-{N'-[4-(4-diphenylamino)phenyl]phenyl-N-phenylamino}phenyl)methacrylamide] (abbreviation: PTPDMA), or poly [N,N'-bis(4-butylphenyl)-N,N'-bis(phenyl)benzidine] (abbreviation: Poly-TPD). Alternatively, it is also possible to use, for example, a high molecular compound to which acid is added, such as poly(3,4-ethylenedioxythiophene)/poly(styrenesulfonic acid) (abbreviation: PEDOT/PSS) or polyaniline/poly(styrenesulfonic acid) (PAni/PSS).

As the electron-accepting material that is used for the hole-injection layer, a material similar to the material that can be used for the first compound can be used.

As the electron-accepting material used for the hole-injection layer, an oxide of a metal belonging to any of Group 4 to Group 8 of the periodic table can also be used. Specific examples include molybdenum oxide, vanadium oxide, niobium oxide, tantalum oxide, chromium oxide, tungsten oxide, manganese oxide, and rhenium oxide. Among these, molybdenum oxide is particularly preferable since it is stable in the air, has a low hygroscopic property, and is easy to handle.

The hole-transport materials used for the hole-injection layer and the hole-transport layer are preferably substances with a hole mobility greater than or equal to $1 \times 10^{-6}$ cm$^2$/Vs. Note that other substances can also be used as long as they have a property of transporting more holes than electrons.

As hole-transport materials that can be used for the hole-injection layer and the hole-transport layer, the hole-transport material that can be used as the second compound is given.

Other hole-transport materials that can be used for the hole-injection layer and the hole-transport layer (some of them are overlapped with the above description) are listed below.

As the hole-transport material, a π-electron rich heteroaromatic compound (e.g., a carbazole derivative, a thiophene derivative, and a furan derivative), aromatic amine (a compound having an aromatic amine skeleton), or the like is preferable.

Examples of the carbazole derivative (a compound having a carbazole skeleton) include a bicarbazole derivative (e.g., a 3,3'-bicarbazole derivative) and aromatic amine having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(1,1'-biphenyl-4-yl)-3,3'-bi-9H-carbazole, 9,9'-bis(1,1'-biphenyl-3-yl)-3,3'-bi-9H-carbazole, 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: βNCCP).

Specific examples of the aromatic amine having a carbazolyl group include PCBA1BP, N-(4-biphenyl)-N-(9,9-dimethyl-9H-fluoren-2-yl)-9-phenyl-9H-carbazol-3-amine (abbreviation: PCBiF), PCBBiF, PCBBi1BP, PCBANB, PCBNBB, 4-phenyldiphenyl-(9-phenyl-9H-carbazol-3-yl) amine (abbreviation: PCA1BP), N,N-bis(9-phenylcarbazol-3-yl)-N,N-diphenylbenzene-1,3-diamine (abbreviation: PCA2B), N,N,N'-triphenyl-N,N,N'-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl] fluoren-2-amine (abbreviation: PCBAF), PCBASF, PCzPCA1, PCzPCA2, PCzPCN1, 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N-bis[4-(carbazol-9-yl)phenyl]-N,N-diphenyl-9,9- dimethylfluorene-2,7-diamine (abbreviation: YGA2F), and 4,4',4''-tris(carbazol-9-yl)triphenylamine (abbreviation: TCTA).

In addition to the above, other examples of the carbazole derivative include PCzN2,3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris [4-(N-carbazolyl)phenyl]benzene (abbreviation: TCPB), and 9-[4-(10-phenyl-9-anthracenyl)phenyl]-9H-carbazole (abbreviation: CzPA).

Specific examples of the thiophene derivative (a compound having a thiophene skeleton) and the furan derivative (a compound having a furan skeleton) include compounds having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV), 4,4',4''-(benzene-1,3,5-triyl)tri (dibenzofuran) (abbreviation: DBF3P-II), and 4-{3-[3-(9-phenyl-9H-fluoren-9-yl)phenyl]phenyl}dibenzofuran (abbreviation: mmDBFFLBi-II).

Specific examples of the aromatic amine include 4,4'-bis [N-(1-naphthyl)-N-phenylamino]biphenyl (abbreviation: NPB or α-NPD), N,N-bis(3-methylphenyl)-N,N-diphenyl-[1,1'-biphenyl]-4,4'-diamine (abbreviation: TPD), 4,4'-bis [N-(spiro-9,9'-bifluoren-2-yl)-N-phenylamino]biphenyl (abbreviation: BSPB), BPAFLP, mBPAFLP, N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]spiro-9,9'-bifluorene (abbreviation: DPA2SF), 4,4',4''-tris [N-(1-naphthyl)-N-phenylamino]triphenylamine (abbreviation: 1'-TNATA), TDATA, m-MTDATA, N,N-di(p-tolyl)-N,N-diphenyl-p-phenylenediamine (abbreviation: DTDPPA), DPAB, DNTPD, and DPA3B.

As the hole-transport material, a high molecular compound such as PVK, PVTPA, PTPDMA, or Poly-TPD can also be used.

The hole-transport material is not limited to the above examples, and one of or a combination of various known materials can be used as the hole-transport material in the hole-injection layer and the hole-transport layer.

<Light-Emitting Layer>

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

The light-emitting layer may contain one or more kinds of organic compounds (e.g., a host material and an assist material) in addition to the light-emitting substance (a guest material). As the one or more kinds of organic compounds, one or both of the hole-transport material and the electron-transport material described in this embodiment can be used. As the one or more kinds of organic compounds, a bipolar material may be used.

There is no particular limitation on the light-emitting substance that can be used for the light-emitting layer, and it is possible to use a light-emitting substance that converts singlet excitation energy into light emission in the visible light range or the near-infrared light range or a light-emitting substance that converts triplet excitation energy into light emission in the visible light range or the near-infrared light range.

As an example of the light-emitting substance that converts singlet excitation energy into light, a substance that exhibits fluorescence (a fluorescent substance) can be given; examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N-bis(3-methylphenyl)-N,N-bis[3-(9-phenyl-9H-fluoren-9-yl)phenyl] pyrene-1,6-diamine (abbreviation: 1,6mMemFLPAPrn), N,N-diphenyl-N,N-bis[4-(9-phenyl-9H-fluoren-9-yl)phenyl]pyrene-1,6-diamine (abbreviation: 1,6FLPAPrn), N,N-bis(dibenzofuran-2-yl)-N,N-diphenylpyrene-1,6-diamine (abbreviation: 1,6FrAPrn), N,N-bis(dibenzothiophen-2-yl)-N,N-diphenylpyrene-1,6-diamine (abbreviation: 1,6ThAPrn), N,N-(pyrene-1,6-diyl)bis[(N-phenylbenzo[b] naphtho [1,2-d]furan)-6-amine] (abbreviation: 1,6BnfAPrn), N,N-(pyrene-1,6-diyl)bis[(N-phenylbenzo[b]naphtho [1,2-d]furan)-8-amine] (abbreviation: 1,6BnfAPm-02), and N,N-(pyrene-1,6-diyl)bis[(6,N-diphenylbenzo[b]naphtho[1,2-d]furan)-8-amine] (abbreviation: 1,6BnfAPrn-03). Condensed aromatic diamine compounds typified by pyrenediamine compounds such as 1,6FLPAPrn, 1,6mMemFLPAPrn, and 1,6BnfAPm-03 are particularly preferable because of their high hole-trapping properties, high emission efficiency, and high reliability.

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8,11-tetra(tert-butyl)perylene (abbreviation: TBP), N,N'-(2-tert-butylanthracene-9,10-diyldi-4,1-phenylene)bis[N,N,N-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N-triphenyl-1,4-phenylenediamine (abbreviation: 2DPAPPA), 3,10-bis[N-(9-phenyl-9H-carbazol-2-yl)-N-phenylamino]naphtho [2,3-b;6,7-b'] bisbenzofuran (abbreviation: 3,10PCA2Nbf(IV)-02), 3,10-bis[N-(dibenzofuran-3-yl)-N-phenylamino]naphtho[2,3-b; 6,7-b']bisbenzofuran (abbreviation: 3,10FrA2Nbf(IV)-02), or the like.

Examples of the light-emitting substance that converts triplet excitation energy into light include a substance emitting phosphorescence (phosphorescent substance) and a substance exhibiting thermally activated delayed fluorescence ((Thermally Activated Delayed Fluorescence: TADF) material).

Examples of the phosphorescent substance include an organometallic complex (particularly an iridium complex) including a 4H-triazole skeleton, a 1H-triazole skeleton, an imidazole skeleton, a pyrimidine skeleton, a pyrazine skeleton, or a pyridine skeleton; an organometallic complex (particularly an iridium complex) in which a phenylpyridine derivative including an electron-withdrawing group is a ligand; a platinum complex; and a rare earth metal complex.

As a phosphorescent substance that emits blue or green light and whose emission spectrum has a peak wavelength at greater than or equal to 450 nm and less than or equal to 570 nm, the following substances can be given.

The examples include organometallic complexes including a 4H-triazole skeleton, such as tris {2-[5-(2-methylphenyl)-4-(2,6-dimethylphenyl)-4H-1,2,4-triazol-3-yl-κN2] phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris [4-(3-biphenyl)-5-isopropyl-3-phenyl-4H-1,2,4-triazolato]iridium(III) (abbreviation: [Ir (iPrptz-3b)$_3$]), and tris[3-(5-biphenyl)-5-isopropyl-4-phenyl-4H-1,2,4-triazolato]iridium(III) (abbreviation: Ir(iPr5btz)$_3$]); organometallic complexes including a 1H-triazole skeleton, such as tris[3-methyl-1-(2-methylphenyl)-5-phenyl-1H-1,2,4-triazolato]iridium(III) (abbreviation: [Ir (Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes including an imidazole skeleton, such as fac-tris[1-(2,6-diisopropylphenyl)-2-phenyl-1H-imidazole]iridium(III) (abbreviation: [Ir(iPrpmi)$_3$]), and tris [3-(2,6-dimethylphenyl)-7-methylimidazo[1,2-f] phenanthridinato]iridium(III) (abbreviation: [Ir(dmpimpt-Me)$_3$]); organometallic complexes in which a phenylpyridine derivative including an electron-withdrawing group is a ligand, such as bis[2-(4',6'-difluorophenyl) pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium (III) picolinate (abbreviation: [Ir(CF$_3$ppy)$_2$(pic)]), and bis [2-(4',6'-difluorophenyl)pyridinato-N,C$^{2'}$]iridium(III) acetylacetonate (abbreviation: FIr(acac)); and the like.

As a phosphorescent substance that emits green or yellow light and whose emission spectrum has a peak wavelength at greater than or equal to 495 nm and less than or equal to 590 nm, the following substances can be given.

The examples include organometallic iridium complexes including a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium (III) (abbreviation: [Ir(tBuppm)$_3$]), (acetylacetonato)bis(6-methyl-4-phenylpyrimidinato)iridium(III) (abbreviation: [Ir (mppm)$_2$(acac)]), (acetylacetonato)bis(6-tert-butyl-4-phenylpyrimidinato)iridium(III) (abbreviation: [Ir (tBuppm)$_2$(acac)]), (acetylacetonato)bis[6-(2-norbornyl)-4-phenylpyrimidinato]iridium(III) (abbreviation: [Ir(nbppm)$_2$ (acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato) bis{4,6-dimethyl-2-[6-(2,6-dimethylphenyl)-4-pyrimidinyl-κN3]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes including a pyrazine skeleton, such as (acetylacetonato)bis (3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes including a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenyl quinolinato-N,C$^{2'}$)iridium(III) (abbreviation: [Ir(pq)$_3$]), bis(2-phenylquinolinato-N,C$^{2'}$)iridium(III) acetylacetonate (abbreviation: [Ir(pq)$_2$(acac)]), [2-(4-phenyl-2-pyridinyl-κN)phenyl-κC]bis[2-(2-pyridinyl-κN)phenyl-κC]iridium(III) (abbreviation: [Ir(ppy)$_2$(4dppy)]), and bis[2-(2-pyridinyl-κN)phenyl-κC][2-(4-methyl-5-phenyl-2-pyridinyl-κN)phenyl-κC]; organometallic complexes such as bis(2,4-diphenyl-1,3-oxazolato-N,C$^{2'}$)iridium(III) acetylacetonate (abbreviation: [Ir(dpo)$_2$(acac)]), bis{2-[4'-(perfluorophenyl)phenyl]pyridinato-N,C$^{2'}$}iridium(III) acetylacetonate (abbreviation: [Ir(p-PF-ph)$_2$(acac)]), and bis(2-phenylbenzothiazolato-N,C$^{2'}$)iridium(III) acetylacetonate (abbreviation: [Ir(bt)$_2$(acac)]); and rare earth metal complexes such as tris(acetylacetonato) (monophenanthroline)terbium(III) (abbreviation: [Tb(acac)$_3$(Phen)]).

As a phosphorescent substance that emits yellow or red light and whose emission spectrum has a peak wavelength at greater than or equal to 570 nm and less than or equal to 750 nm, the following substances can be given.

The examples include organometallic complexes including a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), bis[4,6-di(naphthalen-1-yl)pyrimidinato](dipivaloylmethanato)iridium(III) (abbreviation: [Ir(d1npm)$_2$(dpm)]), and tris(4-t-butyl-6-phenylpyrimidinato)iridium(III) (abbreviation: [Ir(tBuppm)$_3$]); organometallic complexes including a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis {4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis {4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-dmCP)$_2$(dpm)]), (acetylacetonato)bis[2-methyl-3-phenylquinoxalinato-N,C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir(dpq)$_2$(acac)]), (acetylacetonato)bis[2,3-bis(4-fluorophenyl)quinoxalinato]iridium(III) (abbreviation: [Ir(Fdpq)$_2$(acac)]), and bis {4,6-dimethyl-2-[5-(5-cyano-2-methylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-m5CP)$_2$(dpm)]); organometallic complexes including a pyridine skeleton, such as tris(1-phenylisoquinolinato-N,C$^{2'}$)iridium(III) (abbreviation: [Ir(piq)$_3$]), bis(1-phenylisoquinolinato-N,C$^{2'}$)iridium(III) acetylacetonate (abbreviation: [Ir(piq)$_2$(acac)]), and bis[4,6-dimethyl-2-(2-quinolinyl-κN)phenyl-κC](2,4-pentanedionato-κ$^2$O,O')iridium(III); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato) (monophenanthroline)europium(III) (abbreviation: [Eu(DBM)$_3$(Phen)]) and tris [1-(2-thenoyl)-3,3,3-trifluoroacetonato] (monophenanthroline)europium(III) (abbreviation: [Eu(TTA)$_3$(Phen)]).

As the organic compounds (e.g., the host material and the assist material) used in the light-emitting layer, one or more kinds of substances having a larger energy gap than the light-emitting substance can be used.

As an organic compound used in combination with the fluorescent substance, it is preferable to use an organic compound that has a high energy level in a singlet excited state and has a low energy level in a triplet excited state.

In terms of a preferable combination with the light-emitting substance (the fluorescent substance or the phosphorescent substance), specific examples of the organic compounds are shown below though some of them overlap the specific examples shown above.

Examples of the organic compound that can be used in combination with the fluorescent substance include fused polycyclic aromatic compounds, such as an anthracene derivative, a tetracene derivative, a phenanthrene derivative, a pyrene derivative, a chrysene derivative, and a dibenzo[g,p]chrysene derivative.

Specific examples of the organic compound used in combination with the fluorescent substance include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), PCPN, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N,N,N',N',N'',N'''-octaphenyldibenzo[g,p]chrysene-2,7,10,15-tetraamine (abbreviation: DBC 1), CzPA, 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho [1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, 5,12-bis(biphenyl-2-yl)tetracene, and 9-(1-naphthyl)-10-[4-(2-naphthyl)phenyl]anthracene (abbreviation: αN-βNPAnth).

As the organic compound used in combination with the phosphorescent substance, an organic compound that has higher triplet excitation energy (energy difference between a ground state and a triplet excited state) than the light-emitting substance is selected.

In the case where a plurality of organic compounds (e.g., a first host material and a second host material (or an assist material)) are used in combination with the light-emitting substance in order to form an exciplex, the plurality of organic compounds are preferably mixed with a phosphorescent substance (particularly an organometallic complex).

Such a structure makes it possible to efficiently obtain light emission utilizing ExTET (Exciplex-Triplet Energy Transfer), which is energy transfer from an exciplex to a light-emitting substance. Note that a combination of a plurality of organic compounds that easily forms an exciplex is preferable, and it is particularly preferable to combine a compound that easily accepts holes (a hole-transport material) and a compound that easily accepts electrons (an electron-transport material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. As the hole-transport material and the electron-transport material, specifically, any of the materials described in this embodiment can be used. With this structure, high efficiency, low voltage driving, and a long lifetime of the light-emitting device can be achieved at the same time.

In a combination of materials for forming an exciplex, the HOMO level of the hole-transport material is preferably higher than or equal to the HOMO level of the electron-transport material. The LUMO level (lowest unoccupied molecular orbital level) of the hole-transport material is preferably higher than or equal to the LUMO level of the electron-transport material. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

Examples of the organic compound that can be used in combination with the phosphorescent substance include an aromatic amine (a compound including an aromatic amine skeleton), a carbazole derivative, a dibenzothiophene derivative (a thiophene derivative), a dibenzofuran derivative (a furan derivative), a zinc- or aluminum-based metal complex, an oxadiazole derivative, a triazole derivative, a benzimidazole derivative, a quinoxaline derivative, a dibenzoquinoxaline derivative, a pyrimidine derivative, a triazine derivative, a pyridine derivative, a bipyridine derivative, and a phenanthroline derivative.

The above-described specific examples of the hole-transport material can be given as specific examples of the aromatic amine, the carbazole derivative, the dibenzothiophene derivative, and the dibenzofuran derivative, which are organic compounds having a high hole-transport property.

Specific examples of the zinc- and aluminum-based metal complexes, which are organic compounds having a high electron-transport property, include metal complexes including a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq).

A metal complex having an oxazole skeleton or a metal complex having a thiazole skeleton, such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like can also be used.

Specific examples of the oxadiazole derivative, the triazole derivative, the benzimidazole derivative, the quinoxaline derivative, the dibenzoquinoxaline derivative, and the phenanthroline derivative, which are organic compounds having a high electron-transport property, include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2-{4-[9,10-di(naphthalen-2-yl)-2-anthryl]phenyl}-1-phenyl-1H-benzimidazole (abbreviation: ZADN), 2,2′,2″-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), 4,4′-bis(5-methylbenzoxazol-2-yl)stilbene (abbreviation: BzOs), bathophenanthroline (abbreviation: Bphen), bathocuproine (abbreviation: BCP), 2,9-bis(naphthalen-2-yl)-4,7-diphenyl-1,10-phenanthroline (abbreviation: NBphen), 2-[3-(dibenzothiophen-4-yl)phenyl]dibenzo[f,h]quinoxaline (abbreviation: 2mDBTPDBq-II), 2-[3′-(dibenzothiophen-4-yl)biphenyl-3-yl]dibenzo[f,h]quinoxaline (abbreviation: 2mDBTBPDBq-II), 2-[3′-(9H-carbazol-9-yl)biphenyl-3-yl]dibenzo quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Specific examples of a heterocyclic compound having a diazine skeleton, a heterocyclic compound having a triazine skeleton, and a heterocyclic compound having a pyridine skeleton, which are organic compounds having a high electron-transport property, include 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9′-phenyl-2,3′-bi-9H-carbazole (abbreviation: mPCCzPTzn-02), 2-[3′-(9,9-dimethyl-9H-fluoren-2-yl)-1,1′-biphenyl-3-yl]-4,6-diphenyl-1,3,5-triazine (abbreviation: mFBPTzn), 2-[(1,1′-biphenyl)-4-yl]-4-phenyl-6-[9,9′-spirobi(9H-fluoren)-2-yl]-

1,3,5-triazine (abbreviation: BP-SFTzn), 2-{3-[3-(benzo[b] naphtho [1,2-d]furan-8-yl)phenyl]phenyl}-4,6-diphenyl-1, 3,5-triazine (abbreviation: mBnfBPTzn), 2-{3-[3-(benzo[b] naphtho [1,2-d]furan-6-yl)phenyl]phenyl}-4,6-diphenyl-1, 3,5-triazine (abbreviation: mBnfBPTzn-02), 3,5-bis(3-(9H-carbazol-9-yl)phenyl)pyridine (abbreviation: 35DCzPPy), and 1,3,5-tri[3-(3-pyridyl)phenyl]benzene (abbreviation: TmPyPB).

As the organic compound having a high electron-transport property, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can also be used.

The TADF material is a material that has a small difference between the $S_1$ level (energy level in a singlet excited state) and the $T_1$ level (energy level in a triplet excited state) and has a function of converting triplet excitation energy into singlet excitation energy by reverse intersystem crossing. Thus, it is possible to upconvert triplet excitation energy into singlet excitation energy (reverse intersystem crossing) using a little thermal energy and to efficiently generate a singlet excited state. In addition, the triplet excitation energy can be converted into light emission. Thermally activated delayed fluorescence is efficiently obtained under the condition where the difference in energy between the $S_1$ level and the $T_1$ level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $10^{-6}$ seconds or longer, preferably $10^{-3}$ seconds or longer.

An exciplex whose excited state is formed by two kinds of substances has an extremely small difference between the $S_1$ level and the $T_1$ level and functions as a TADF material that can convert triplet excitation energy into singlet excitation energy.

A phosphorescent spectrum observed at low temperatures (e.g., 77 K to 10 K) is used for an index of the T1 level. When the level of energy with a wavelength of the line obtained by extrapolating a tangent to the fluorescent spectrum at a tail on the short wavelength side is the $S_1$ level and the level of energy with a wavelength of the line obtained by extrapolating a tangent to the phosphorescent spectrum at a tail on the short wavelength side is the $T_1$ level, the difference between $S_1$ and $T_1$ of the TADF material is preferably less than or equal to 0.3 eV, further preferably less than or equal to 0.2 eV.

The TADF material may be used as a guest material or a host material.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

Alternatively, it is possible to use a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1, 3,5-triazine (abbreviation: PIC-TRZ), PCCzPTzn, 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro [acridin-9,9'-anthracen]-10'-one (abbreviation: ACRSA). The heterocyclic compound is preferable because of having both a high electron-transport property and a high hole-transport property owing to a π-electron rich heteroaromatic ring and a π-electron deficient heteroaromatic ring. Note that an aromatic ring to which an electron-withdrawing group such as a cyano group is bonded may be used instead of the π-electron deficient heteroaromatic ring. Furthermore, a π-electron deficient skeleton can be used instead of the π-electron deficient heteroaromatic ring. Similarly, a π-electron rich skeleton can be used instead of the π-electron rich heteroaromatic ring.

Among skeletons having a π-electron deficient heteroaromatic ring, a pyridine skeleton, a diazine skeleton (a pyrimidine skeleton, a pyrazine skeleton, or a pyridazine skeleton), and a triazine skeleton are preferable because of their high stability and reliability. In particular, a benzofuropyrimidine skeleton, a benzothienopyrimidine skeleton, a benzofuropyrazine skeleton, and a benzothienopyrazine skeleton are preferable because of their high electron-accepting properties and reliability.

Among skeletons having a π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. In particular, a dibenzofuran skeleton, a dibenzothiophene skeleton, an indole skeleton, a carbazole skeleton, an indolocarbazole skeleton, a bicarbazole skeleton, or a 3-(9-phenyl-9H-carbazol-3-yl)-9H-carbazole skeleton is preferable.

Note that a substance in which a π-electron rich heteroaromatic ring is directly bonded to a π-electron deficient heteroaromatic ring is particularly preferable because both the donor property of the π-electron rich heteroaromatic ring and the acceptor property of the π-electron deficient heteroaromatic ring are improved and the energy difference between the singlet excited state and the triplet excited state becomes small.

As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring including a nitrile group or a cyano group, such as benzonitrile or cyanobenzene, a carbonyl skeleton such as benzophenone, a phosphine oxide skeleton, a sulfone skeleton, or the like can be used.

Note that the TADF material can also be used in combination with another organic compound when being used as the light-emitting substance. In particular, the TADF material can be used in combination with the host material (the hole-transport material and the electron-transport material)

described above. In the case of using the TADF material, the $S_1$ level of the host material is preferably higher than the $S_1$ level of the TADF material. In addition, the $T_1$ level of the host material is preferably higher than the $T_1$ level of the TADF material.

Alternatively, the TADF material may be used as a host material, and a fluorescent substance may be used as a guest material. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. At this time, the TADF material functions as an energy donor, and the light-emitting substance functions as an energy acceptor. Therefore, the use of the TADF material as the host material is very effective in the case where a fluorescent substance is used as the guest material. In that case, the $S_1$ level of the TADF material is preferably higher than the $S_1$ level of the fluorescent substance in order that high emission efficiency can be achieved. Furthermore, the $T_1$ level of the TADF material is preferably higher than the $S_1$ level of the fluorescent substance. Therefore, the $T_1$ level of the TADF material is preferably higher than the $T_1$ level of the fluorescent substance.

It is preferable to use a TADF material that exhibits light emission whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order that singlet excitation energy is efficiently generated from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon group are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituent having no π bond has a poor carrier-transport property, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

<Electron-Injection Layer and Electron-Transport Layer>

The electron-injection layer has a function of facilitating injection of electrons to the EL layer. For example, the electron-injection layer can have a function of injecting electrons injected from the cathode to the electron-transport layer (or the light-emitting layer). For example, the electron-injection layer can have a function of generating electrons and injecting the electrons to the electron-transport layer (or the light-emitting layer, for example).

For the electron-injection layer, a material having a high electron-injection property (electron-injection material) can be used.

For the electron-injection layer, a composite material containing a material having a high electron-transport property (electron-transport material) and an electron-donating material (donor material) can also be used. In this case, the electron-donating material extracts holes from the electron-transport material, so that electrons are generated in the electron-injection layer and the electrons are injected into the light-emitting layer through the electron-transport layer. Note that the electron-injection layer may be formed using a single layer of a composite material containing an electron-transport material and an electron-donating material, or may be formed using a stack including a layer of an electron-transport material and a layer of an electron-donating material.

The electron-transport layer is a layer that transports electronss to the light-emitting layer.

For the electron-transport layer, an electron-transport material can be used.

As the electron-injection material, a material similar to the material that can be used as the second substance can be used.

As an electron-donating material that is used for the electron-injection layer, a substance that exhibits an electron-donating property with respect to the electron-transport material can be used. Specifically, a material similar to a material that can be used as the second substance can be used.

The electron-transport materials used for the electron-injection layer and the electron-transport layer are preferably substances with an electron mobility greater than or equal to $1\times10^{-6}$ cm$^2$/Vs. Note that other substances can also be used as long as they have a property of transporting more electrons than holes.

As the electron-transport material, an electron-transport material that can be used as the first organic compound can be used.

For manufacture of the light-emitting device of one embodiment of the present invention, a vacuum process such as an evaporation method or a solution process such as a spin coating method or an ink-jet method can be used. In the case of using an evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layer, the hole-transport layer, the light-emitting layer, the electron-transport layer, the electron-injection layer, and the like) included in the EL layer can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

Materials of the functional layers included in the light-emitting device are not limited to the above-described corresponding materials. For example, as the materials of the functional layers, a high molecular compound (e.g., an oligomer, a dendrimer, and a polymer), a middle molecular compound (a compound between a low molecular compound and a high molecular compound with a molecular weight of greater than or equal to 400 and less than or equal to 4000), or an inorganic compound (e.g., a quantum dot material) may be used. As the quantum dot material, a colloidal quantum dot material, an alloyed quantum dot material, a core-shell quantum dot material, a core quantum dot material, or the like can be used.

As described above, the light-emitting device of this embodiment includes the second layer, which has a lower concentration of the first substance (a metal, a metallic salt, a metal oxide, or an organometallic salt) than the first layer, between the first layer containing the first substance and the third layer containing the second substance (electron-injection material). With such a structure, the injection property of electrons from the third layer to the second layer, furthermore to the first layer is increased, which can reduce the driving voltage of the light-emitting device. As a result, the reliability of the light-emitting device can be increased.

This embodiment can be combined with the other embodiments as appropriate. In this specification, in the case where a plurality of structure examples are shown in one embodiment, the structure examples can be combined as appropriate.

Embodiment 2

In this embodiment, a light-emitting apparatus of one embodiment of the present invention will be described with reference to FIG. 3 to FIG. 5.

Structure Example 1 of Light-Emitting Apparatus

Figure 3A:
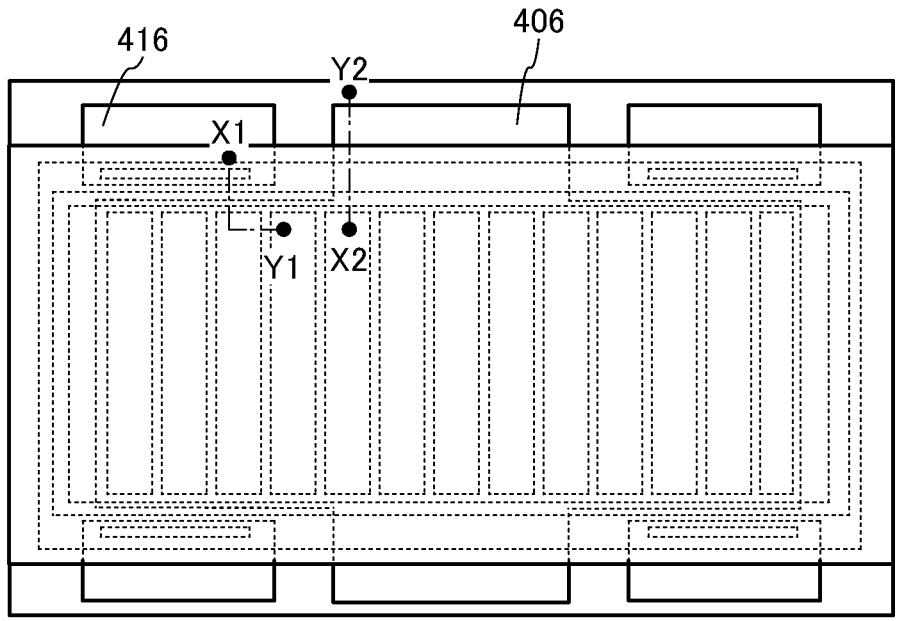
FIG. 3A is a top view illustrating an example of a light-emitting apparatus.
Figure 3B:
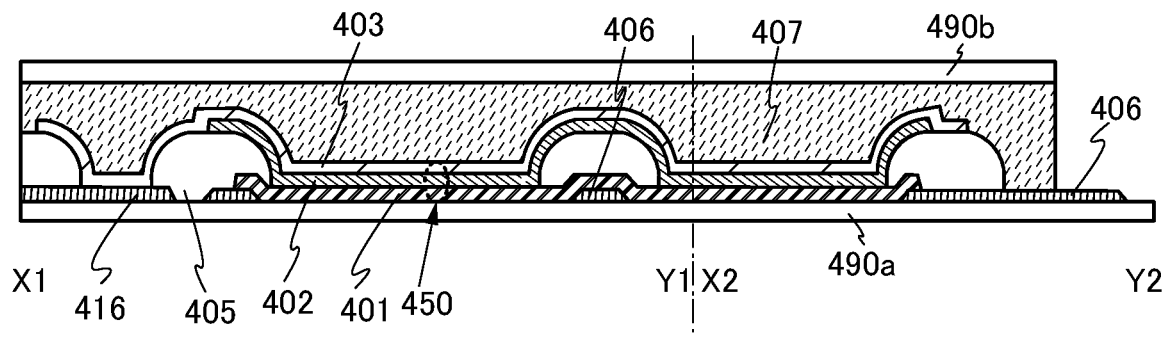
FIG. 3B and FIG. 3C are cross-sectional views illustrating examples of a light-emitting apparatus.
Figure 3C:
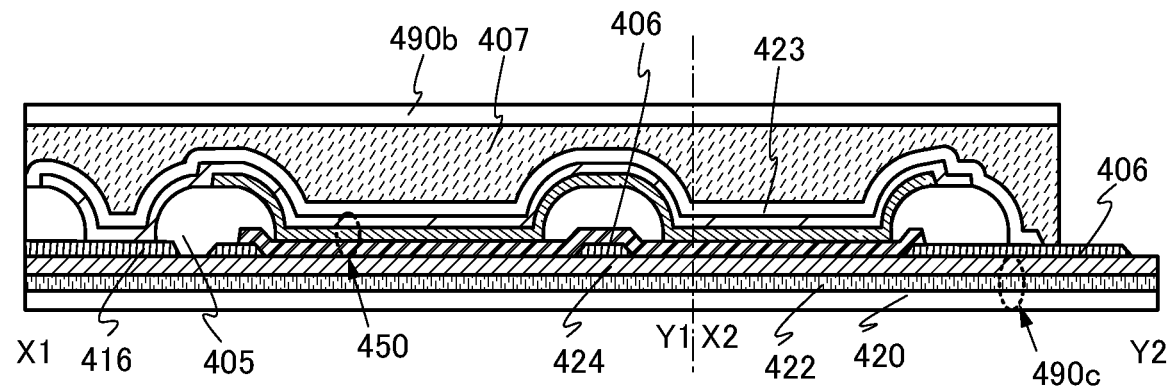

FIG. 3A is a top view of a light-emitting apparatus, and FIG. 3B and FIG. 3C are cross-sectional views along the dashed-dotted lines X1-Y1 and X2-Y2 in FIG. 3A. The light-emitting apparatus illustrated in FIG. 3A to FIG. 3C can be used as a lighting device, for example. The light-emitting apparatus can have a bottom-emission, top-emission, or dual-emission structure.

The light-emitting apparatus illustrated in FIG. 3B includes a substrate 490a, a substrate 490b, a conductive layer 406, a conductive layer 416, an insulating layer 405, an organic EL device 450 (a first electrode 401, an EL layer 402, and a second electrode 403), and an adhesive layer 407. The structure of the light-emitting device of one embodiment of the present invention described in Embodiment 1 is preferably applied to the organic EL device 450.

The organic EL device 450 includes the first electrode 401 over the substrate 490a, the EL layer 402 over the first electrode 401, and the second electrode 403 over the EL layer 402. The organic EL device 450 is sealed by the substrate 490a, the adhesive layer 407, and the substrate 490b.

End portions of the first electrode 401, the conductive layer 406, and the conductive layer 416 are covered with the insulating layer 405. The conductive layer 406 is electrically connected to the first electrode 401, and the conductive layer 416 is electrically connected to the second electrode 403. The conductive layer 406 covered with the insulating layer 405 with the first electrode 401 positioned therebetween functions as an auxiliary wiring and is electrically connected to the first electrode 401. It is preferable that the auxiliary wiring electrically connected to the electrode of the organic EL device 450 be provided, in which case a voltage drop due to the resistance of the electrode can be inhibited. The conductive layer 406 may be provided over the first electrode 401. An auxiliary wiring that is electrically connected to the second electrode 403 may be provided, for example, over the insulating layer 405.

For each of the substrate 490a and the substrate 490b, glass, quartz, ceramic, sapphire, an organic resin, or the like can be used. When a flexible material is used for the substrate 490a and the substrate 490b, the flexibility of the display device can be increased.

A light-emitting surface of the light-emitting apparatus may be provided with a light extraction structure for increasing the light extraction efficiency, an antistatic film preventing the attachment of a foreign substance, a water repellent film suppressing the attachment of stain, a hard coat film suppressing generation of a scratch in use, an impact absorption layer, or the like.

Examples of an insulating material that can be used for the insulating layer 405 include a resin such as an acrylic resin and an epoxy resin, and an inorganic insulating material such as silicon oxide, silicon oxynitride, silicon nitride oxide, silicon nitride, and aluminum oxide.

For the adhesive layer 407, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component resin may be used. An adhesive sheet or the like may be used.

The light-emitting apparatus illustrated in FIG. 3C includes a barrier layer 490c, the conductive layer 406, the conductive layer 416, the insulating layer 405, the organic EL device 450, the adhesive layer 407, a barrier layer 423, and the substrate 490b.

The barrier layer 490c illustrated in FIG. 3C includes a substrate 420, an adhesive layer 422, and an insulating layer 424 having a high barrier property.

In the light-emitting apparatus illustrated in FIG. 3C, the organic EL device 450 is provided between the insulating layer 424 having a high barrier property and the barrier layer 423. Thus, even when resin films with relatively low water resistance or the like are used as the substrate 420 and the substrate 490b, a reduction in lifetime due to entry of impurities such as water into the organic EL device can be suppressed.

For each of the substrate 420 and the substrate 490b, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like can be used. Glass that is thin enough to have flexibility may be used for the substrate 420 and the substrate 490*b*.

An inorganic insulating film is preferably used as the insulating layer 424 having a high barrier property. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

The barrier layer 423 preferably includes at least a single-layer inorganic film. For example, the barrier layer 423 can have a single-layer structure of an inorganic film or a stacked-layer structure of an inorganic film and an organic film. As the inorganic film, the above-described inorganic insulating film is preferable. An example of the stacked-layer structure is a structure in which a silicon oxynitride film, a silicon oxide film, an organic film, a silicon oxide film, and a silicon nitride film are formed in this order. When the protective layer has a stacked-layer structure of an inorganic film and an organic film, entry of impurities that can enter the organic EL device 450 (typically, hydrogen, water, and the like) can be suitably suppressed.

The insulating layer 424 having a high barrier property and the organic EL device 450 can be directly formed on the substrate 420 having flexibility. In that case, the adhesive layer 422 is not necessary. The insulating layer 424 and the organic EL device 450 can be formed over a rigid substrate with a separation layer provided therebetween and then transferred to the substrate 420. For example, the insulating layer 424 and the organic EL device 450 may be transferred to the substrate 420 in the following manner: the insulating layer 424 and the organic EL device 450 are separated from the rigid substrate by applying heat, force, laser light, or the like to the separation layer, and then the insulating layer 424 and the organic EL device 450 are bonded to the substrate 420 with the use of the adhesive layer 422. For the separation layer, a stacked-layer structure of inorganic films including a tungsten film and a silicon oxide film, or an organic resin film of polyimide or the like can be used, for example. In the case where a rigid substrate is used, the insulating layer 424 can be formed at high temperature as compared to the case where a resin substrate or the like is used; thus, the insulating layer 424 can have high density and an excellent barrier property.

Structure Example 2 of Light-Emitting Apparatus

Figure 4A:
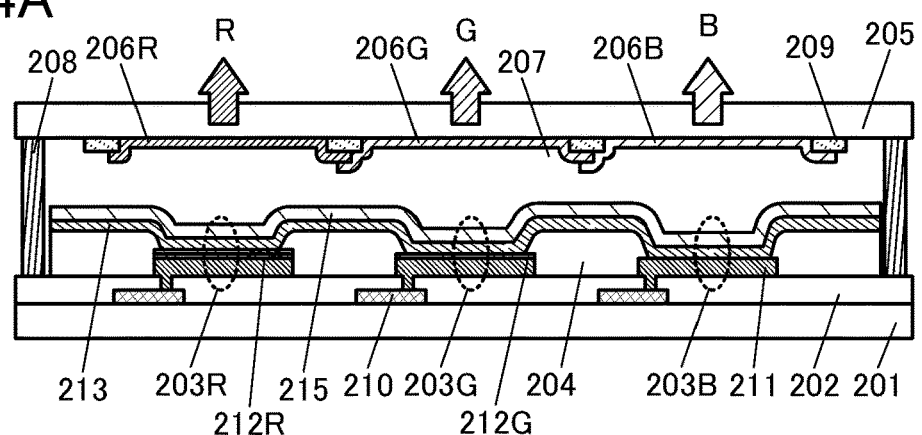
FIG. 4A to FIG. 4D are cross-sectional views illustrating examples of a light-emitting apparatus.

FIG. 4A is a top view of the light-emitting apparatus. The light-emitting apparatus illustrated in FIG. 4A is an active-matrix light-emitting apparatus in which a transistor is electrically connected to a light-emitting device.

The light-emitting apparatus illustrated in FIG. 4A includes a substrate 201, a transistor 210, a light-emitting device 203R, a light-emitting device 203G, a light-emitting device 203B, a color filter 206R, a color filter 206G, a color filter 206B, a substrate 205, and the like.

In FIG. 4A, the transistor 210 is provided over the substrate 201, the insulating layer 202 is provided over the transistor 210, and the light-emitting devices 203R, 203G, and 203B are provided over the insulating layer 202.

The transistor 210 and the light-emitting devices 203R, 203G, and 203B are sealed in a space 207 surrounded by the substrate 201, the substrate 205, and the adhesive layer 208. The space 207 can be filled with, for example, a reduced-pressure atmosphere, an inert atmosphere, or a resin.

In the light-emitting apparatus illustrated in FIG. 4A, one pixel includes a red subpixel (R), a green subpixel (G), and a blue subpixel (B).

The light-emitting apparatus of one embodiment of the present invention includes a plurality of pixels arranged in a matrix. One pixel includes one or more subpixels. One subpixel includes one light-emitting device. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y).

Figure 4B:
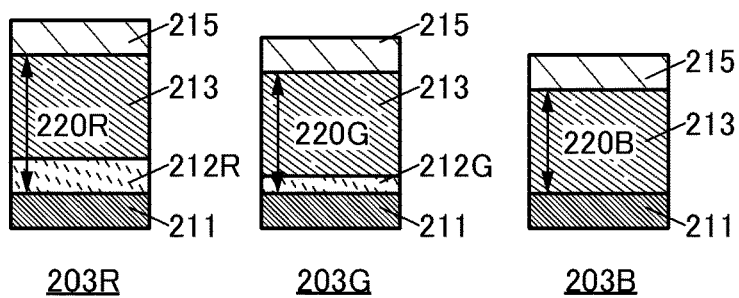

FIG. 4B illustrates detailed structures of the light-emitting device 203R, the light-emitting device 203G, and the light-emitting device 203B. The light-emitting devices 203R, 203G, and 203B include the EL layer 213 in common, and have microcavity structures in which the optical path length between electrodes of each light-emitting device is adjusted in accordance with the emission color of the light-emitting device. To each of the light-emitting devices, the light-emitting device of one embodiment of the present invention described in Embodiment 1 is preferably applied.

The first electrode 211 functions as a reflective electrode and the second electrode 215 functions as a transflective electrode.

In the light-emitting device 203R, the optical path length between the first electrode 211 and the second electrode 215 is adjusted to be an optical path length 220R in order to enhance the intensity of red light. Similarly, in the light-emitting device 203G, the optical path length between the first electrode 211 and the second electrode 215 is adjusted to be an optical path length 220G in order to enhance the intensity of green light. In the light-emitting device 203B, the optical path length between the first electrode 211 and the second electrode 215 is adjusted to be an optical path length 220B in order to enhance the intensity of blue light.

Optical adjustment can be performed in such a manner that a conductive layer 212R is formed over the first electrode 211 in the light-emitting device 203R and a conductive layer 212G is formed over the first electrode 211 in the light-emitting device 203G as illustrated in FIG. 4B. Furthermore, in the light-emitting device 203B, the optical path length 220B may be adjusted by forming a conductive layer whose thickness is different from those of the conductive layer 212R and the conductive layer 212G over the first electrode 211. Note that as illustrated in FIG. 4A, end portions of the first electrode 211, the conductive layer 212R, and the conductive layer 212G are covered with an insulating layer 204.

The light-emitting apparatus illustrated in FIG. 4A is a top-emission light-emitting apparatus, which emits light obtained from the light-emitting devices through color filters formed on the substrate 205. The color filter can transmit visible light in a specific wavelength range and block visible light in a specific wavelength range.

In the red subpixel (R), light from the light-emitting device 203R is emitted through the red color filter 206R. As illustrated in FIG. 4A, the color filter 206R that transmits only light in the red wavelength range is provided in a position overlapping with the light-emitting device 203R, whereby red light emission can be obtained from the light-emitting device 203R.

Similarly, in the green subpixel (G), light from the light-emitting device 203G is emitted through the green color filter 206G, and in the blue subpixel (B), light from the light-emitting device 203B is emitted through the blue color filter 206B.

Note that a black matrix 209 (also referred to as a black layer) may be provided at an end portion of one type of color filter. Furthermore, the color filters for the respective colors and the black matrix 209 may be covered with an overcoat layer that transmits visible light.

Figure 4C:
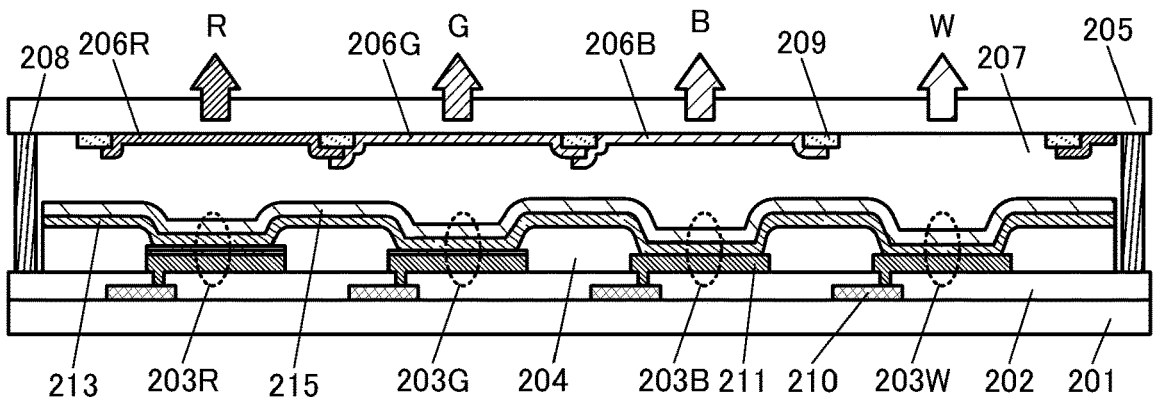

In the light-emitting apparatus illustrated in FIG. 4C, one pixel includes the red subpixel (R), the green subpixel (G), the blue subpixel (B), and a white subpixel (W). In FIG. 4C, light from a light-emitting device 203W included in the white subpixel (W) is emitted to the outside of the light-emitting apparatus without passing through a color filter.

Note that the optical path length between the first electrode 211 and the second electrode 215 in the light-emitting device 203W may be the same as the optical path length in any one of the light-emitting devices 203R, 203G, and 203B or may be different from the optical path lengths in the light-emitting devices 203R, 203G, and 203B.

In the case where the intensity of light with a blue wavelength is desired to be enhanced, for example, in the case where light emitted from the light-emitting device 203W is white light with a low color temperature, the optical path length in the light-emitting device 203W is preferably equal to the optical path length 220B in the light-emitting device 203B, as illustrated in FIG. 4C. Thus, light obtained from the light-emitting device 203W can be made closer to white light with a desired color temperature.

Figure 4D:
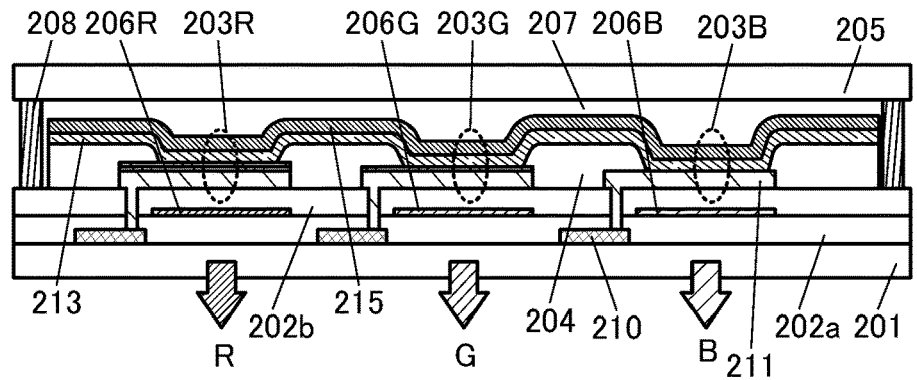

Although FIG. 4A illustrates the top-emission light-emitting apparatus, a light-emitting apparatus with a (bottom emission) structure in which light is extracted to the substrate 201 side where the transistor 210 is formed as illustrated in FIG. 4D is also one embodiment of the present invention.

In the bottom-emission light-emitting apparatus, color filters for the respective colors are preferably provided between the substrate 201 and the light-emitting devices. FIG. 4D illustrates an example in which the transistor 210 is formed over the substrate 201, an insulating layer 202a is formed over the transistor 210, the color filters 206R, 206G, and 206B are formed over the insulating layer 202a, an insulating layer 202b is formed over the color filters 206R, 206G, and 206B, and the light-emitting devices 203R, 203G, and 203B are formed over the insulating layer 202b.

In the case of the top-emission light-emitting apparatus, a light-blocking substrate or a light-transmitting substrate can be used as the substrate 201, and a light-transmitting substrate can be used as the substrate 205.

In the case of the bottom-emission light-emitting apparatus, a light-blocking substrate or a light-transmitting substrate can be used as the substrate 205, and a light-transmitting substrate can be used as the substrate 201.

Structure Example 3 of Light-Emitting Apparatus

The light-emitting apparatus of one embodiment of the present invention can be of passive matrix type or active matrix type. An active-matrix light-emitting apparatus will be described with reference to FIG. 5.

Figure 5A:
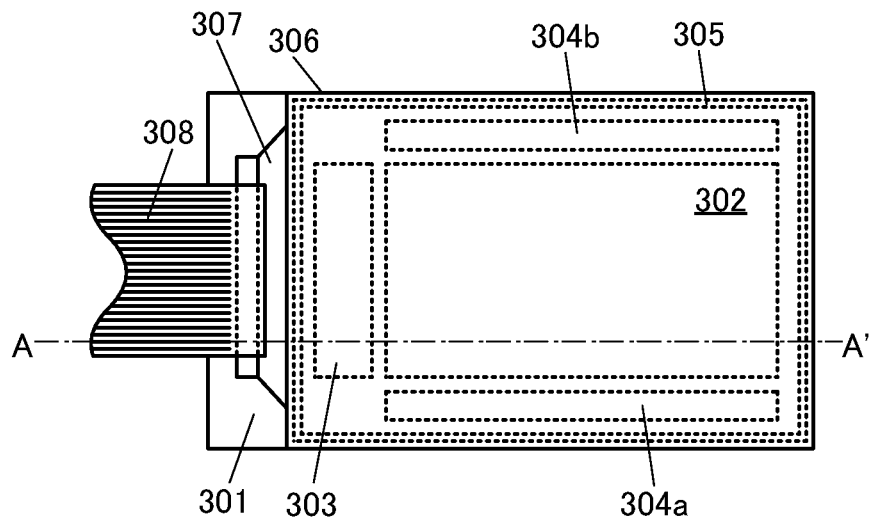
FIG. 5A is a top view illustrating an example of a light-emitting apparatus.
Figure 5B:
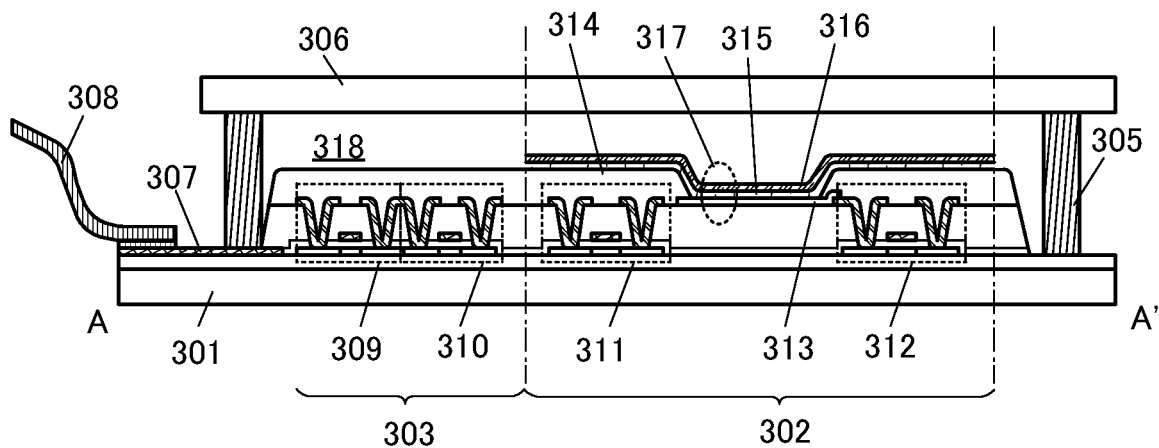
FIG. 5B is a cross-sectional view illustrating an example of a light-emitting apparatus.

FIG. 5A is a top view of the light-emitting apparatus. FIG. 5B is a cross-sectional view along the dashed-dotted line A-A' in FIG. 5A.

The active-matrix light-emitting apparatus illustrated in FIG. 5A and FIG. 5B includes a pixel portion 302, a circuit portion 303, a circuit portion 304a, and a circuit portion 304b.

Each of the circuit portion 303, the circuit portion 304a, and the circuit portion 304b can function as a scan line driver circuit (a gate driver) or a signal line driver circuit (a source driver), or may be a circuit that electrically connects the pixel portion 302 to an external gate driver or source driver.

A lead wiring 307 is provided over a first substrate 301. The lead wiring 307 is electrically connected to an FPC 308 that is an external input terminal. The FPC 308 transmits signals (e.g., a video signal, a clock signal, a start signal, and a reset signal) and a potential from the outside to the circuit portion 303, the circuit portion 304a, and the circuit portion 304b. The FPC 308 may be provided with a printed wiring board (PWB). The structure illustrated in FIG. 5A and FIG. 5B can also be referred to as a light-emitting module including a light-emitting device (or a light-emitting apparatus) and an FPC.

The pixel portion 302 includes a plurality of pixels each including an organic EL device 317, a transistor 311, and a transistor 312. To the organic EL device 317, the light-emitting device of one embodiment of the present invention described in Embodiment 1 is preferably applied. The transistor 312 is electrically connected to a first electrode 313 included in the organic EL device 317. The transistor 311 functions as a switching transistor. The transistor 312 functions as a current control transistor. Note that the number of transistors included in each pixel is not particularly limited and can be set appropriately as needed.

The circuit portion 303 includes a plurality of transistors, such as a transistor 309 and a transistor 310. The circuit portion 303 may be configured with a circuit including transistors having the same conductivity type (either n-channel transistors or p-channel transistors), or may be configured with a CMOS circuit including an n-channel transistor and a p-channel transistor. Furthermore, a driver circuit may be provided outside.

There is no particular limitation on the structure of the transistor included in the light-emitting apparatus of this embodiment. For example, a planar transistor, a staggered transistor, or an inverted staggered transistor can be used. A top-gate or a bottom-gate transistor structure may be used; or gates may be provided above and below a semiconductor layer where a channel is formed.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) can be used. A semiconductor having crystallinity is preferably used, in which case deterioration of the transistor characteristics can be suppressed.

It is preferable that the semiconductor layer of the transistor contain a metal oxide (also referred to as an oxide semiconductor); or the semiconductor layer of the transistor may contain silicon. Examples of silicon include amorphous silicon and crystalline silicon (e.g., low-temperature polysilicon and single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

The transistors included in the circuit portion 303, the circuit portion 304a, and the circuit portion 304b and the transistors included in the pixel portion 302 may have the same structure or different structures. A plurality of transistors included in the circuit portion 303, the circuit portion 304a, and the circuit portion 304b may have the same structure or two or more kinds of structures. Similarly, a plurality of transistors included in the pixel portion 302 may have the same structure or two or more kinds of structures.

An end portion of the first electrode 313 is covered with an insulating layer 314. For the insulating layer 314, an organic compound such as a negative photosensitive resin or a positive photosensitive resin (acrylic resin), or an inorganic compound such as silicon oxide, silicon oxynitride, or silicon nitride can be used. An upper end portion or a lower end portion of the insulating layer 314 preferably has a curved surface with curvature. In that case, favorable coverage with a film formed over the insulating layer 314 can be obtained.

An EL layer 315 is provided over the first electrode 313, and a second electrode 316 is provided over the EL layer 315. The EL layer 315 includes a light-emitting layer, a hole-injection layer, a hole-transport layer, an electron-transport layer, an electron-injection layer, a charge-generation layer, and the like.

The plurality of transistors and the plurality of organic EL devices 317 are sealed by the first substrate 301, a second substrate 306, and a sealant 305. A space 318 surrounded by the first substrate 301, the second substrate 306, and the sealant 305 may be filled with an inert gas (e.g., nitrogen or argon) or an organic substance (including the sealant 305).

An epoxy resin or glass frit can be used for the sealant 305. A material that transmits moisture and oxygen as little as possible is preferably used for the sealant 305. In the case where glass frit is used for the sealant, the first substrate 301 and the second substrate 306 are preferably glass substrates in terms of adhesion.

Figure 5C:
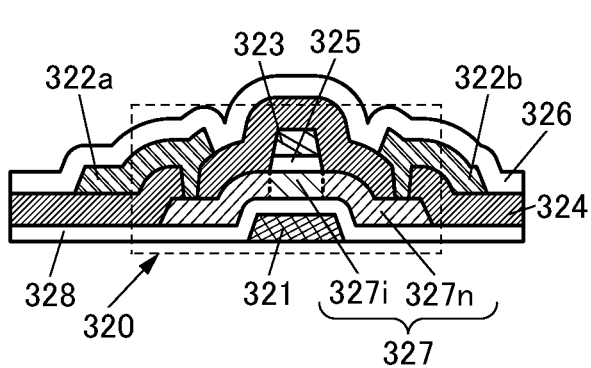
FIG. 5C and FIG. 5D are cross-sectional views of examples of a transistor.
Figure 5D:
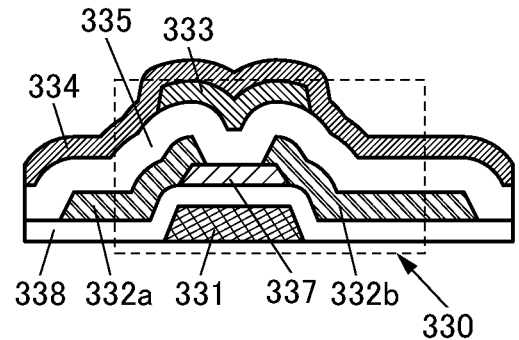

FIG. 5C and FIG. 5D illustrate examples of transistors that can be used in a light-emitting apparatus.

A transistor 320 illustrated in FIG. 5C includes a conductive layer 321 functioning as a gate, an insulating layer 328 functioning as a gate insulating layer, a semiconductor layer 327 including a channel formation region 327i and a pair of low-resistance regions 327n, a conductive layer 322a connected to one of the pair of low-resistance regions 327n, a conductive layer 322b connected to the other of the pair of low-resistance regions 327n, an insulating layer 325 functioning as a gate insulating layer, a conductive layer 323 functioning as a gate, and an insulating layer 324 covering the conductive layer 323. The insulating layer 328 is positioned between the conductive layer 321 and the channel formation region 327i. The insulating layer 325 is positioned between the conductive layer 323 and the channel formation region 327i. The transistor 320 is preferably covered with an insulating layer 326. The insulating layer 326 may be included as a component in the transistor 320.

The conductive layer 322a and the conductive layer 322b are each connected to the low-resistance region 327n through openings in the insulating layer 324. One of the conductive layer 322a and the conductive layer 322b functions as a source and the other functions as a drain.

The insulating layer 325 is provided to overlap with at least the channel formation region 327i of the semiconductor layer 327. The insulating layer 325 may cover top surfaces and side surfaces of the pair of low-resistance regions 327n.

A transistor 330 illustrated in FIG. 5D includes a conductive layer 331 functioning as a gate, an insulating layer 338 functioning as a gate insulating layer, a conductive layer 332a and a conductive layer 332b which function as a source and a drain, a semiconductor layer 337, an insulating layer 335 functioning as a gate insulating layer, and a conductive layer 333 functioning as a gate. The insulating layer 338 is positioned between the conductive layer 331 and the semiconductor layer 337. The insulating layer 335 is positioned between the conductive layer 333 and the semiconductor layer 337. The transistor 330 is preferably covered with an insulating layer 334. The insulating layer 334 may be included as a component in the transistor 330.

The structure in which the semiconductor layer where a channel is formed is provided between two gates is used for the transistor 320 and the transistor 330. The two gates may be connected to each other and supplied with the same signal to drive the transistor; or a potential for adjusting the threshold voltage may be supplied to one of the two gates and a potential for driving may be supplied to the other to adjust the threshold voltage of the transistor.

A material through which impurities such as water and hydrogen do not easily diffuse is preferably used for at least one of the insulating layers that cover the transistors. Thus, such an insulating layer can function as a barrier layer. Such a structure can effectively inhibit diffusion of impurities into the transistors from the outside and increase the reliability of the light-emitting apparatus.

An inorganic insulating film is preferably used as the insulating layer 325, the insulating layer 326, the insulating layer 328, the insulating layer 334, the insulating layer 335, and the insulating layer 338. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Note that as materials that can be used for the conductive layers included in the light-emitting apparatus, metals such as aluminum, titanium, chromium, nickel, copper, yttrium, zirconium, molybdenum, silver, tantalum, and tungsten, alloys containing these metals as its main component, and the like can be given. A single layer or stacked-layer structure including a film including these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used because it increases controllability of a shape by etching.

This embodiment can be combined with the other embodiments as appropriate.

Embodiment 3

In this embodiment, electronic devices of one embodiment of the present invention will be described with reference to drawings.

Examples of electronic devices include a television set, a monitor of a computer or the like, a digital camera, a digital video camera, a digital photo frame, a mobile phone (also referred to as a cellular phone or a mobile phone device), a portable game machine, a portable information terminal, an audio reproducing device, a large game machine such as a pinball machine, a biometric authentication device, and a testing device.

The electronic devices of one embodiment of the present invention include the light-emitting apparatus of one embodiment of the present invention in its display portion and thus has high reliability.

The display portion of the electronic device in this embodiment can display a video with a resolution of, for example, full high definition, 4K2K, 8K4K, 16K8K, or higher. As a screen size of the display portion, the diagonal size can be greater than or equal to 20 inches, greater than or equal to 30 inches, greater than or equal to 50 inches, greater than or equal to 60 inches, or greater than or equal to 70 inches.

The electronic device of one embodiment of the present invention has flexibility and therefore can be incorporated along a curved surface of an inside or outside wall of a house or a building or a curved surface of an interior or an exterior of an automobile.

The electronic device of one embodiment of the present invention may include a secondary battery. It is preferable that the secondary battery be capable of being charged by contactless power transmission.

Examples of the secondary battery include a lithium ion secondary battery such as a lithium polymer battery using a gel electrolyte (a lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display a video, information, or the like on a display portion. When the electronic device includes the antenna and a secondary battery, the antenna may be used for contactless power transmission.

The electronic device of this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of this embodiment can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 6A:
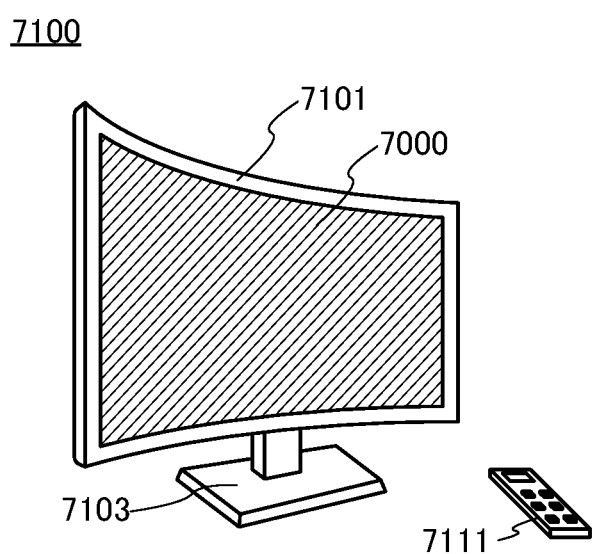
FIG. 6A to FIG. 6D are diagrams illustrating examples of electronic devices.

FIG. 6A shows an example of a television device. In a television device 7100, a display portion 7000 is incorporated in a housing 7101. Here, a structure in which the housing 7101 is supported by a stand 7103 is illustrated.

The light-emitting apparatus of one embodiment of the present invention can be applied to the display portion 7000. The use of the light-emitting apparatus of one embodiment of the present invention for the display portion 7000 can increase the reliability of the television device 7100.

The television device 7100 illustrated in FIG. 6A can be operated with an operation switch provided in the housing 7101 or a separate remote controller 7111; or the display portion 7000 may include a touch sensor, and the television device 7100 can be operated by touching the display portion 7000 with a finger or the like. The remote controller 7111 may include a display portion for displaying information output from the remote controller 7111. With a touch panel or operation keys provided in the remote controller 7111, channels and volume can be controlled, and videos displayed on the display portion 7000 can be controlled.

Note that the television device 7100 is provided with a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) information communication can be performed.

Figure 6B:
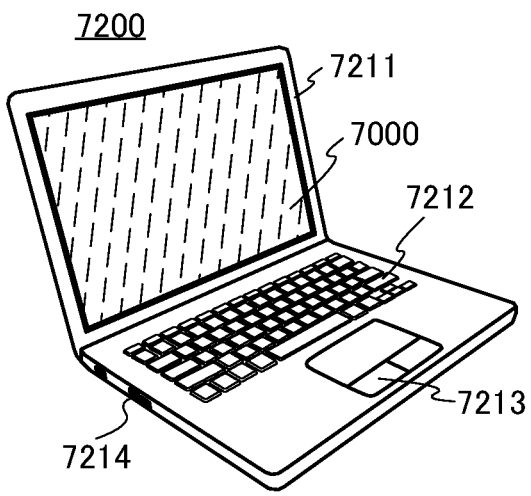

FIG. 6B shows an example of a laptop personal computer. A laptop personal computer 7200 includes a housing 7211, a keyboard 7212, a pointing device 7213, an external connection port 7214, and the like. The display portion 7000 is incorporated in the housing 7211.

The light-emitting apparatus of one embodiment of the present invention can be used for the display portion 7000. The use of the light-emitting device of one embodiment of the present invention for the display portion 7000 can improve the reliability of the laptop personal computer 7200.

Figure 6C:
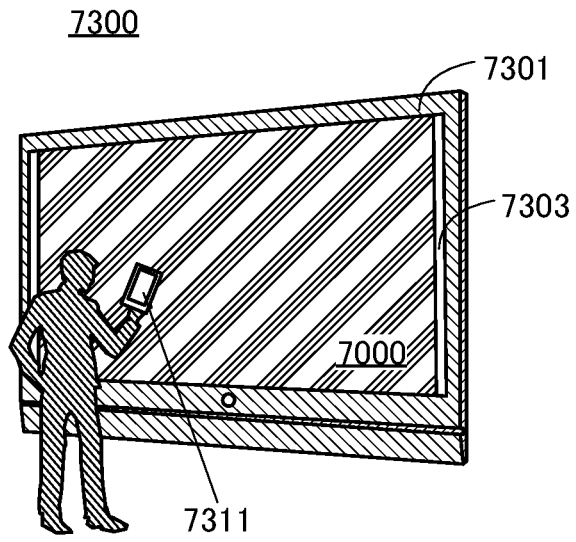
Figure 6D:
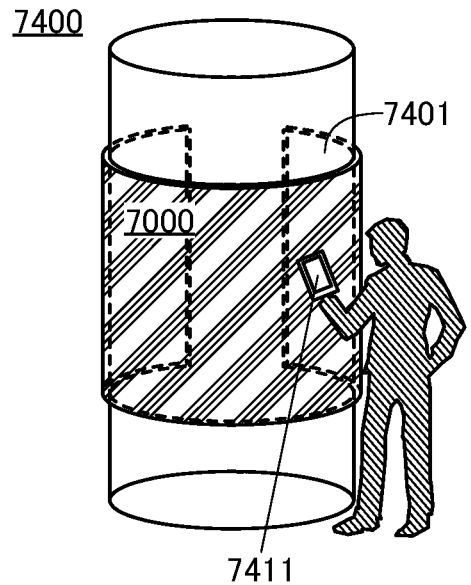

FIG. 6C and FIG. 6D show examples of digital signage.

Digital signage 7300 illustrated in FIG. 6C includes a housing 7301, the display portion 7000, a speaker 7303, and the like. Furthermore, an LED lamp, operation keys (including a power switch or an operation switch), a connection terminal, a variety of sensors, a microphone, and the like can be included.

FIG. 6D illustrates digital signage 7400 mounted on a cylindrical pillar 7401. The digital signage 7400 includes the display portion 7000 provided along a curved surface of the pillar 7401.

The light-emitting apparatus of one embodiment of the present invention can be applied to the display portion 7000 in FIG. 6C and FIG. 6D. The use of the light-emitting apparatus of one embodiment of the present invention for the display portion 7000 can increase the reliability of the digital signages 7300 and 7400.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. For an application for providing information such as route information or traffic information, usability can be enhanced by intuitive operation.

As illustrated in FIG. 6C and FIG. 6D, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

FIG. 7A to FIG. 7F show examples of a portable information terminal including a flexible display portion 7001. The use of the light-emitting apparatus of one embodiment of the present invention for the display portion 7001 can increase the reliability of the portable information terminal.

The display portion 7001 is manufactured using the light-emitting apparatus of one embodiment of the present invention. For example, a light-emitting apparatus that can be bent with a radius of curvature greater than or equal to 0.01 mm and less than or equal to 150 mm can be used. The display portion 7001 may include a touch sensor so that the portable information terminal can be operated by touching the display portion 7001 with a finger or the like.

Figure 7A:
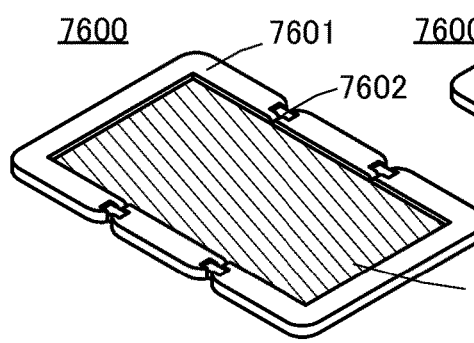
FIG. 7A to FIG. 7F are diagrams illustrating examples of electronic devices.
Figure 7B:
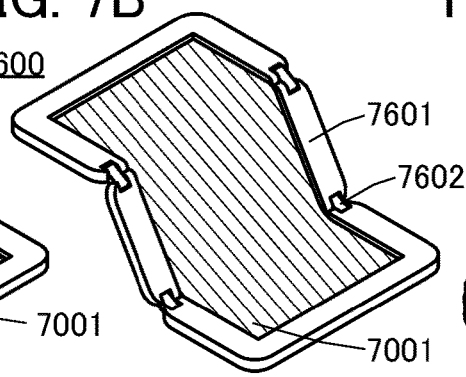
Figure 7C:
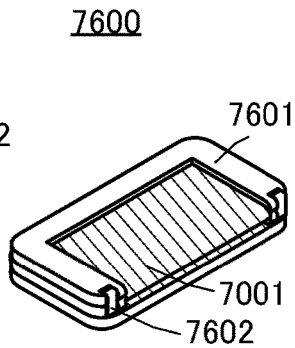

FIG. 7A to FIG. π show an example of a foldable portable information terminal. FIG. 7A illustrates an opened state, FIG. 7B illustrates a state in the middle of change from one of an opened state and a folded state to the other, and FIG. π illustrates a folded state of a portable information terminal 7600. The portable information terminal 7600 has excellent portability when in a folded state. The portable information terminal 7600 has excellent browsability when in an opened state because of its seamless large display region.

The display portion 7001 is supported by three housings 7601 joined together by hinges 7602. By folding a space between two housings 7601 with the hinges 7602, the portable information terminal 7600 can be reversibly changed in shape from an opened state to a folded state.

Figure 7D:
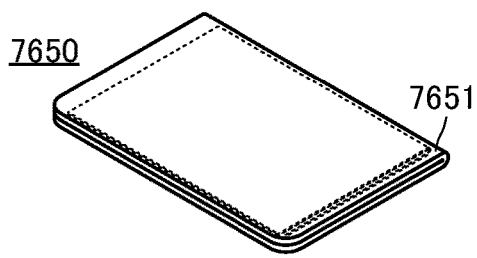
Figure 7E:
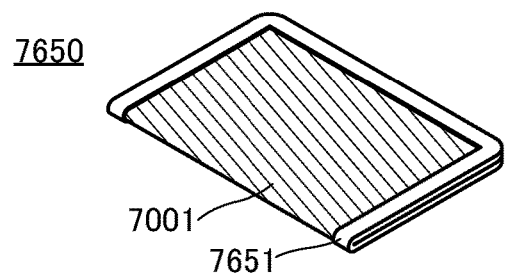

FIG. 7D and FIG. 7E show an example of a foldable portable information terminal. FIG. 7D illustrates a portable information terminal 7650 that is folded so that the display portion 7001 is on the inside; FIG. 7E illustrates the portable information terminal 7650 that is folded so that the display portion 7001 is on the outside. The portable information terminal 7650 includes the display portion 7001 and a non-display portion 7651. Contamination of or damage to the display portion 7001 can be suppressed by folding the portable information terminal 7650 to place the display portion 7001 on the inside when the portable information terminal 7650 is not used.

Figure 7F:
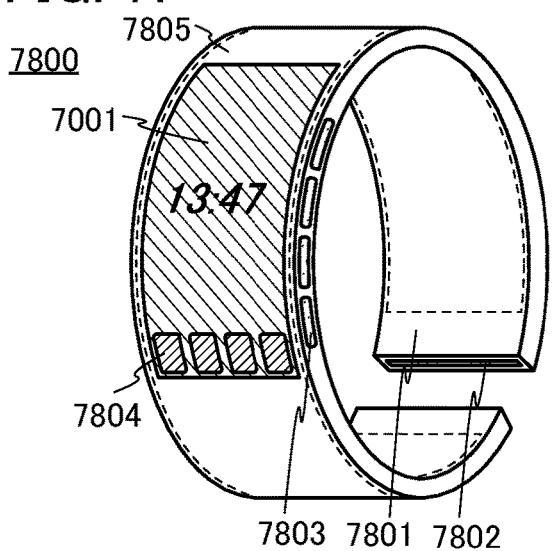

FIG. 7F shows an example of a wrist-watch-type portable information terminal. A portable information terminal 7800 includes a band 7801, the display portion 7001, an input-output terminal 7802, operation buttons 7803, and the like. The band 7801 has a function of a housing. A flexible battery 7805 can be mounted on the portable information terminal 7800. The battery 7805 may be placed to overlap with the display portion 7001 or the band 7801, for example.

The band 7801, the display portion 7001, and the battery 7805 have flexibility. Thus, the portable information terminal 7800 can be easily curved to have a desired shape.

The operation button 7803 can give a variety of functions such as time setting, on/off of the power, on/off of wireless communication, setting and cancellation of silent mode, and setting and cancellation of power saving mode. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can execute near field communication conformable to a communication standard. For example, mutual communication between the portable information terminal and a headset capable of wireless communication can be performed, and thus hands-free calling is possible.

The portable information terminal 7800 may include the input-output terminal 7802. In the case where the input-output terminal 7802 is included, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

Figure 8A:
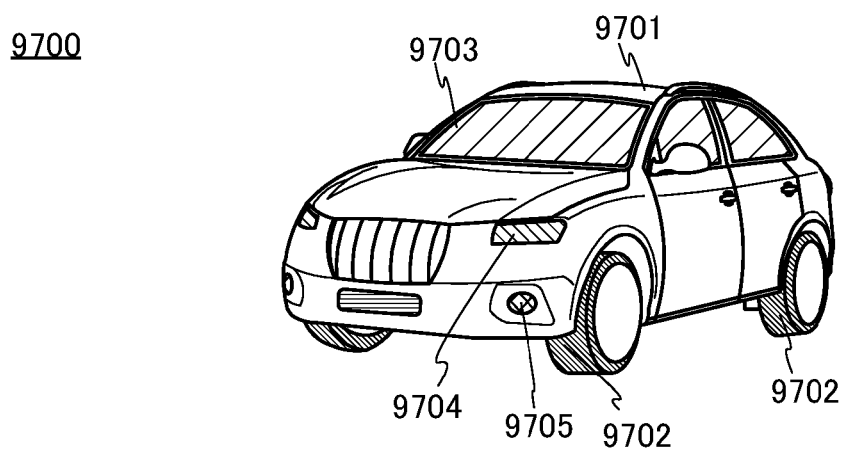
FIG. 8A to FIG. 8C are diagrams illustrating examples of an electronic devices.
Figure 8B:
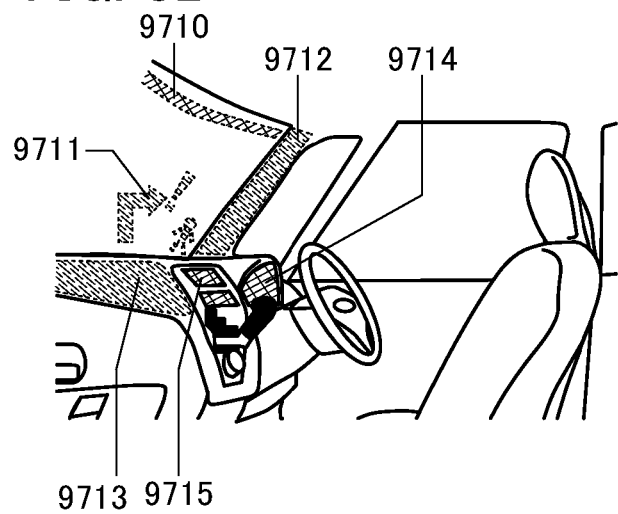

FIG. 8A is an external view of an automobile 9700. FIG. 8B illustrates a driver's seat of the automobile 9700. The automobile 9700 includes a car body 9701, wheels 9702, a windshield 9703, lights 9704, fog lamps 9705, and the like. The light-emitting apparatus of one embodiment of the present invention can be used in a display portion of the automobile 9700, for example. For example, the light-emitting apparatus of one embodiment of the present invention can be provided for a display portion 9710 to a display portion 9715 illustrated in FIG. 8B; or the light-emitting apparatus of one embodiment of the present invention may be used in the lights 9704 or the fog lamps 9705.

The display portion 9710 and the display portion 9711 are display devices provided in an automobile windshield. The light-emitting apparatus of one embodiment of the present invention can be a see-through device, through which the opposite side can be seen, by using a light-transmitting conductive material for forming its electrodes and wirings. Such a display portion 9710 or 9711 in a see-through state does not hinder driver's vision during driving of the automobile 9700. Therefore, the light-emitting apparatus of one embodiment of the present invention can be provided in the windshield of the automobile 9700. In the case where a transistor for driving the light-emitting apparatus is provided, a transistor having a light-transmitting property, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar by displaying an image taken by an imaging means provided on the car body. The display portion 9713 is a display device provided on a dashboard. For example, the display portion 9713 can compensate for the view hindered by the dashboard by displaying an image taken by an imaging means provided on the car body. That is, by displaying an image taken by an imaging means provided on the outside of the automobile, blind areas can be eliminated and safety can be increased. Display of an image that complements the area that cannot be seen makes it possible to confirm safety more naturally and comfortably.

Figure 8C:
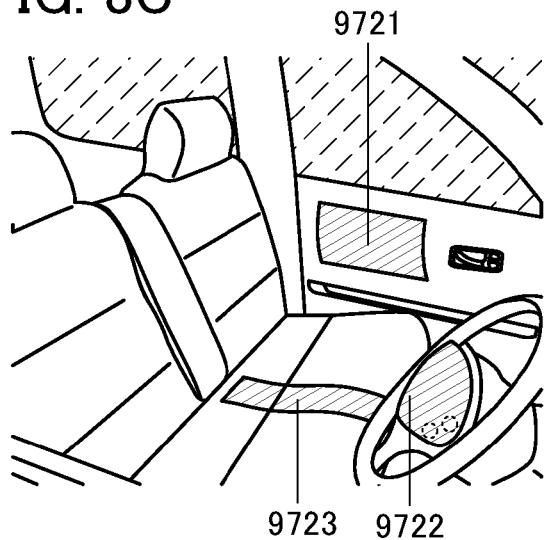

FIG. 8C illustrates the inside of a car in which a bench seat is used as a driver seat and a front passenger seat. A display portion 9721 is a display device provided in a door portion. For example, the display portion 9721 can compensate for the view hindered by the door by displaying an image taken by an imaging means provided in the car body. A display portion 9722 is a display device provided in a steering wheel. A display portion 9723 is a display device provided in the middle of a seating face of the bench seat. Provided on the seating surface, backrest, or the like, the display device can be used as a seat heater with heat generation of the display device as a heat source.

The display portion 9714, the display portion 9715, and the display portion 9722 can provide a variety of kinds of information by displaying navigation data, a speedometer, a tachometer, a mileage, a fuel meter, a gearshift indicator, air-condition setting, and the like. The content, layout, or the like of the display on the display portions can be changed freely by a user as appropriate. The above information can also be displayed on the display portion 9710 to the display portion 9713, the display portion 9721, and the display portion 9723. The display portion 9710 to the display portion 9715 and the display portion 9721 to the display portion 9723 can also be used as lighting devices. The display portion 9710 to the display portion 9715 and the display portion 9721 to the display portion 9723 can also be used as heating devices.

This embodiment can be combined with the other embodiments as appropriate.

Example 1

Figure 9A:
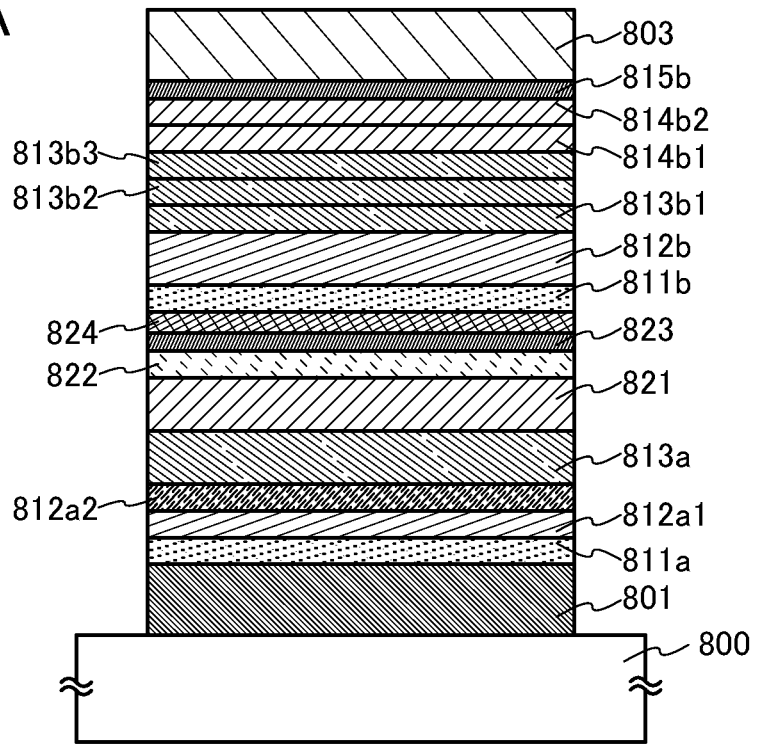
FIG. 9A and FIG. 9B are diagrams illustrating light-emitting devices in Example.

In this example, light-emitting devices of one embodiment of the present invention are fabricated, and the measurement results thereof are described In this example, Device 1 and Device 2 to which one embodiment of the present invention is applied and Comparative Device 3 for comparison were fabricated as light-emitting devices and evaluated, and the results thereof are described. FIG. 9A illustrates the structure of Device 1, Device 2, and Comparative Device 3 used in this example, and Table 1 shows specific components. The chemical formulae of the materials used in this example are shown below.

TABLE 1

| First electrode 801 → | | | | | | | |
|---|---|---|---|---|---|---|---|
| APC (100 nm) | | | | ITSO (10 nm) | | | |
| → Hole-injection layer | Hole-transport layer | | Light-emitting layer | First layer | Second layer | Third layer | Fourth layer → |
| 811a | 812a1 | 812a2 | 813a | 821 | 822 | 823 | 824 |
| BBABnf:ALD-MP001Q (1:0.1 10 nm) | BBABnf (10 nm) | PCzN2 (10 nm) | * | | | Li$_2$O (0.1 nm) | CuPc (2 nm) |

| → Hole-injection layer | Hole-transport layer | Light-emitting layer | → |
|---|---|---|---|
| 811b | 812b | 813b1 | 813b2 |
| DBT3P-II:MoO$_x$ (1:0.5 10 nm) | PCBBiF (15 nm) | 2mDBTBPDBq-II:PCBBiF:Ir(dmdppr-P)$_2$(dibm) (0.6:0.4:0.06 10 nm) | 2mDBTBPDBq-II:PCBBiF:Ir(tBuppm)$_3$ (0.8:0.2:0.06 30 nm) |

| → Light-emitting layer | Electron-transport layer | | Electron injection layer | Second electrode | |
|---|---|---|---|---|---|
| 813b3 | 814b1 | 814b2 | 815b | 803 | |
| 2mDBTBPDBq-II:PCBBiF:Ir(dmdppr-P)$_2$(dbm) (0.6:0.4:0.06 5 nm) | 2mDBTBPDBq-II (10 nm) | NBphen (15 nm) | LiF (1 nm) | Ag:Mg (1:0.1 25 nm) | ITO (70 nm) |

| * | Light-emitting layer 813a | First layer 821 | Second layer 822 |
|---|---|---|---|
| Device 1 | αN-βNPAnth:3,10FrA2Nbf(IV)-02 (1:0.015 25 nm) | ZADN:Liq (1:1 20 nm) | ZADN 5 nm |
| Device 2 | | ZADN:Liq (1:1 20 nm) | NBphen 5 nm |
| Comparative Device 3 | | ZADN:Liq (1:1 25 nm) | |

[Chemical Formula 1]
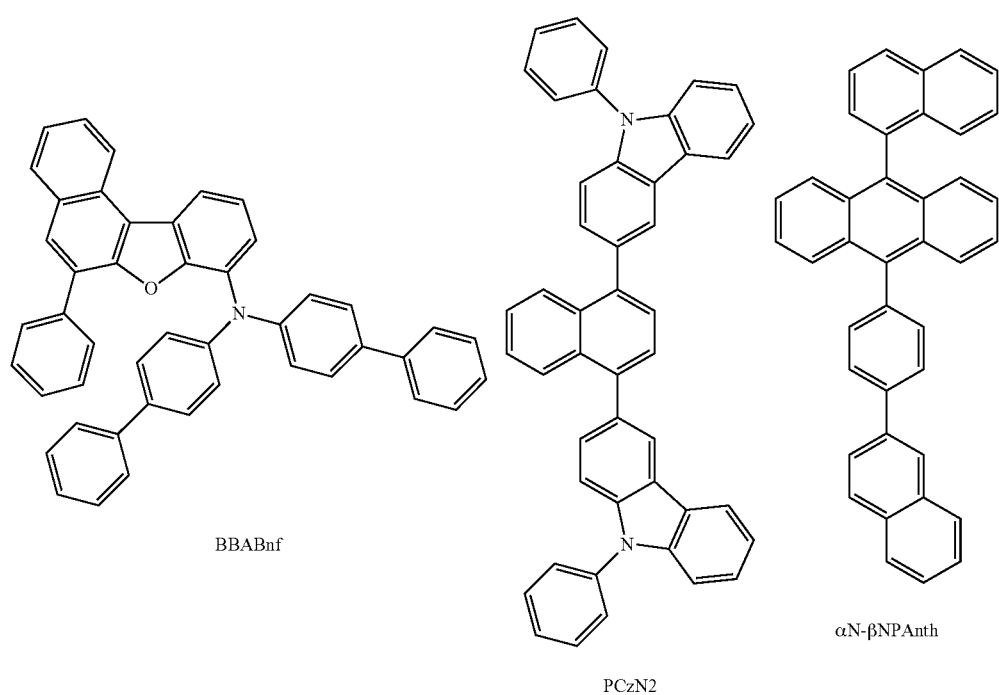
BBABnf
PCzN2
αN-βNPAnth
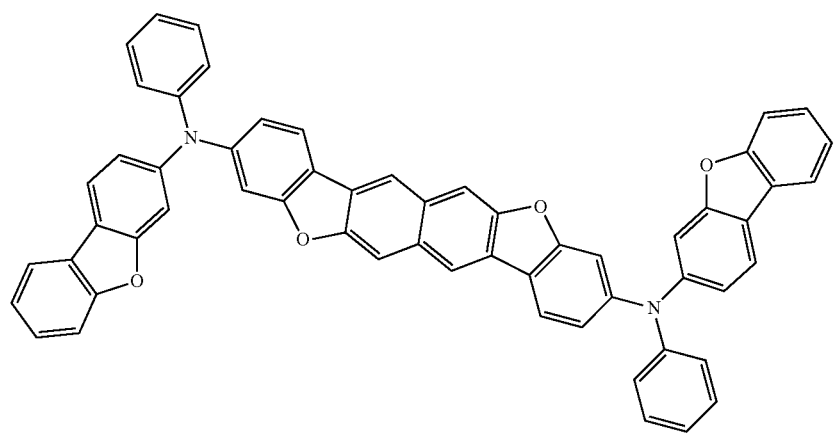
3,10FrA2Nbf(IV)-02

-continued
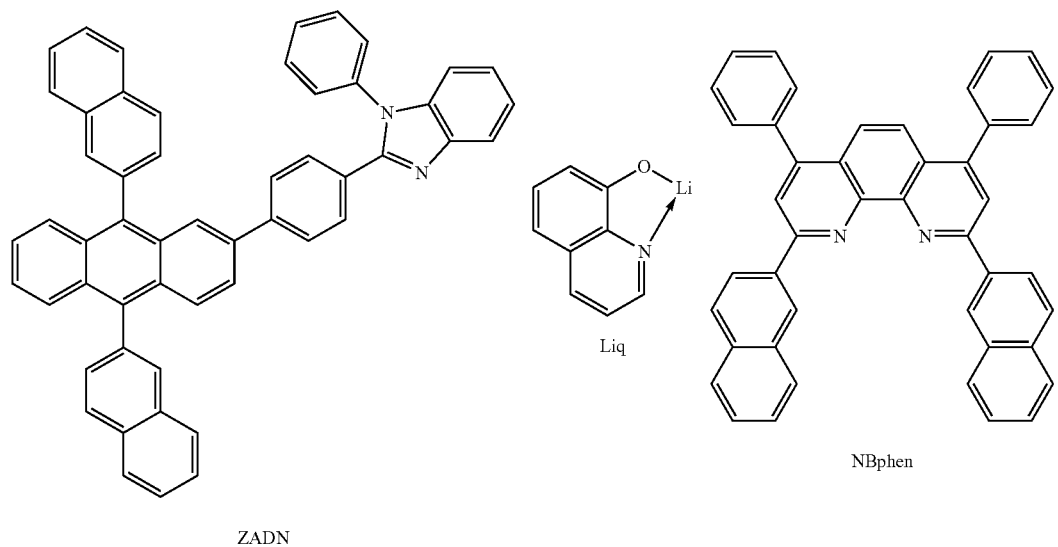
ZADN
Liq
NBphen
CuPc
[Chemical Formula 2]
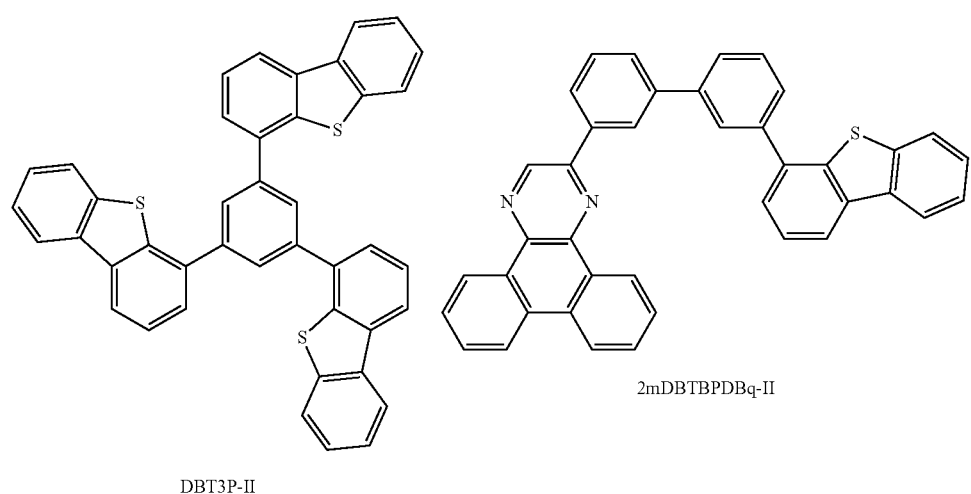
DBT3P-II
2mDBTBPDBq-II

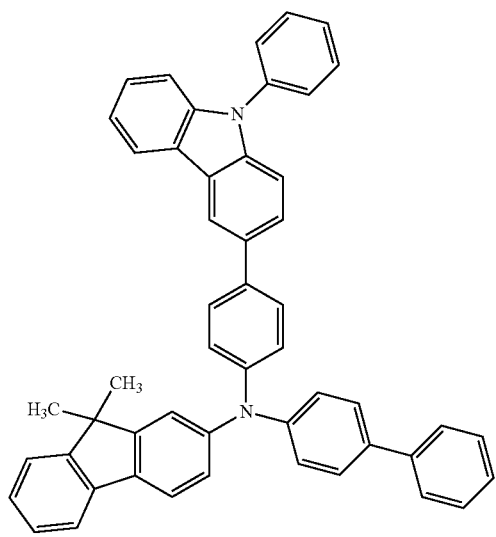

PCBBiF

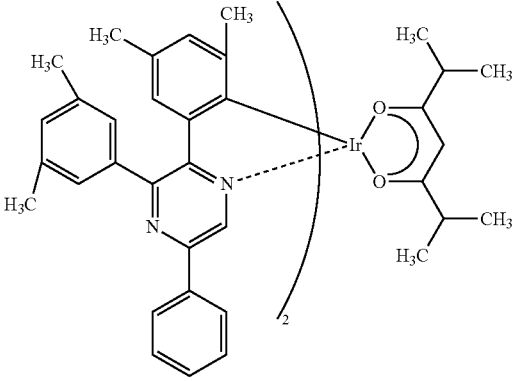

[Ir(dmdppr-P)₂(dibm)]

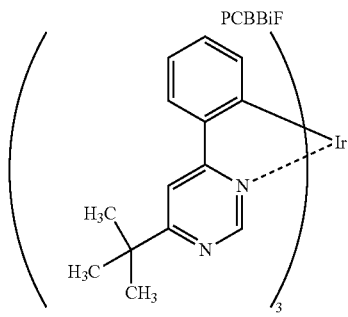

[Ir(tBuppm)₃]

<<Fabrication of Light-Emitting Devices>>

Device 1, Device 2, and Comparative Device 3 described in this example have a structure in which a first electrode 801 is formed over a substrate 800, a hole-injection layer 811a, a hole-transport layer 812a1, a hole-transport layer 812a2, a light-emitting layer 813a, a first layer 821, a second layer 822, a third layer 823, a fourth layer 824, a hole-injection layer 811b, a hole-transport layer 812b, a light-emitting layer 813b1, a light-emitting layer 813b2, a light-emitting layer 813b3, an electron-transport layer 814b1, an electron-transport layer 814b2, and an electron-injection layer 815b are stacked in this order over the first electrode 801, and a second electrode 803 is formed over the electron-injection layer 815b, as illustrated in FIG. 9A.

For each of the light-emitting devices fabricated in this example, a microcavity structure that increases the intensity of blue light was employed.

First, the first electrode 801 was formed over the substrate 800. The electrode area was set to 4 mm² (2 mm×2 mm). A glass substrate was used as the substrate 800. The first electrode 801 was formed in such a manner that an alloy film of silver (Ag), palladium (Pd), and copper (Cu) (Ag—Pd—Cu (APC)) was formed to a thickness of 100 nm by a sputtering method, and a film of indium tin oxide containing silicon oxide (ITSO) was formed to a thickness of 10 nm by a sputtering method. In this example, the first electrode 801 functions as an anode.

As pretreatment, a surface of the substrate was washed with water, baking was performed at 200° C. for one hour, and then UV ozone treatment was performed for 370 seconds. After that, the substrate was transferred into a vacuum evaporation apparatus in which the pressure was reduced to approximately 10⁻⁴ Pa, vacuum baking at 170° C. for 30 minutes was performed in a heating chamber in the vacuum evaporation apparatus, and then the substrate was cooled down for approximately 30 minutes.

Next, the hole-injection layer 811a was formed over the first electrode 801. The hole-injection layer 811a was formed in such a manner that after the pressure in a vacuum evaporation apparatus was reduced to 10' Pa, N,N-bis(4-biphenyl)-6-phenylbenzo[b]naphtho[1,2-d]furan-8-amine (abbreviation: BBABnf) and ALD-MP001Q (produced by Analysis Atelier Corporation, material serial No. 1S20180314) were co-evaporated in a weight ratio of 1:0.1 (=BBABnf: ALD-MP001Q) to have a thickness of 10 nm. ALD-MP001Q has a property of accepting electrons from BBABnf.

Then, the hole-transport layer 812a1 was formed over the hole-injection layer 811a. The hole-transport layer 812a1 was formed to a thickness of 10 nm by evaporation of BBABnf.

Then, the hole-transport layer 812a2 was formed over the hole-transport layer 812a1. The hole-transport layer 812a2 was formed to have a thickness of 10 nm by evaporation of 3,3'-(naphthalen-1,4-diyl)bis(9-phenyl-9H-carbazole) (abbreviation: PCzN2).

Next, the light-emitting layer 813a was formed over the hole-transport layer 812a2. The light-emitting layer 813a was formed to have a thickness of 25 nm by co-evaporation of 9-(1-naphthyl)-10-[4-(2-naphthyl)phenyl]anthracene (abbreviation: αN-βNPAnth) as a host material and 3,10-bis[N-(dibenzofuran-3-yl)-N-phenylamino]naphtho [2,3-b; 6,7-b bisbenzofuran (abbreviation: 3,10FrA2Nbf(IV)-02) as a guest material (a fluorescent substance) in a weight ratio of 1:0.015 (=αN-βNPAnth: 3,10FrA2Nbf(IV)-02].

Next, the first layer 821 was formed over the light-emitting layer 813a. The first layer 821 of each of Device 1 and Device 2 was formed to have a thickness of 20 nm by evaporation of 2-{4-[9,10-di(naphthalen-2-yl)-2-anthryl]phenyl}-1-phenyl-1H-benzimidazole (abbreviation: ZADN) and 8-(quinolinolato)lithium (abbreviation: Liq) (Chemipro Kasei Kaisha, Ltd., serial number: 181201) in a weight ratio of 1:1 (=ZADN:Liq). The first layer 821 in Comparative Device 3 was formed to have a thickness of 25 nm by evaporation of ZADN and Liq in a weight ratio of 1:1 (=ZADN:Liq).

Next, the second layer 822 was formed over the first layer 821. For the second layer 822 in Device 1, ZADN was used, for the second layer 822 in Device 2, 2,9-bis(naphthalen-2-yl)-4,7-diphenyl-1,10-phenanthroline (abbreviation: NBphen) was used, and each of the second layers 822 was formed by evaporation to a thickness of 5 nm. In Comparative Device 3, the second layer 822 was not provided.

Next, the third layer 823 was formed over the second layer 822 (or the first layer 821). The third layer 823 was formed to a thickness of 0.1 nm by evaporation of lithium oxide ($Li_2O$).

Next, the fourth layer 824 was formed over the third layer 823. The fourth layer 824 was formed to a thickness of 2 nm by evaporation of copper phthalocyanine (CuPc).

Next, the hole-injection layer 811b was formed over the fourth layer 824. The hole-injection layer 811b was formed to have a thickness of 10 nm by co-evaporation of 1,3,5-tri(dibenzothiophen-4-yl)benzene (abbreviation: DBT3P-II) and molybdenum oxide in a weight ratio of 1:0.5 (=DBT3P-II: molybdenum oxide)

Then, the hole-transport layer 812b was formed over the hole-injection layer 811b. The hole-transport layer 812b was formed to a thickness of 15 nm by evaporation of N-(1,1'-biphenyl-4-yl)-N-[4-(9-phenyl-9H-carbazol-3-yl)phenyl]-9,9-dimethyl-9H-fluoren-2-amine (abbreviation: PCBBiF).

Next, the light-emitting layer 813b1 was formed over the hole-transport layer 812b. The light-emitting layer 813b1 was formed to have a thickness of 10 nm by co-evaporation of 2-[3'-(dibenzothiophen-4-yl)biphenyl-3-yl]dibenzo[f,h]quinoxaline (abbreviation: 2mDBTBPDBq-II) as a host material, PCBBiF as an assist material, and bis {4,6-dimethyl-2-[3-(3,5-dimethylphenyl)-5-phenyl-2-pyrazinyl-κN]phenyl-κC}(2,6-dimethyl-3,5-heptanedionato-κ$^2$O,O') iridium(III) (abbreviation: [Ir(dmdppr-P)$_2$(dibm)]) as a guest material (a phosphorescent substance) in a weight ratio of 0.6:0.4:0.06 (=2mDBTBPDBq-II:PCBBiF:[Ir(dmdppr-P)$_2$(dibm)]).

Next, the light-emitting layer 813b2 was formed over the light-emitting layer 813b1. The light-emitting layer 813b2 was formed to have a thickness of 30 nm by co-evaporation of 2mDBTBPDBq-II as a host material, PCBBiF as an assist material, and tris(4-t-butyl-6-phenylpyrimidinato)iridium (III) (abbreviation: [Ir(tBuppm)$_3$]) as a guest material (phosphorescent substance) in a weight ratio of 0.8:0.2:0.06 (=2mDBTBPDBq-II:PCBBiF:[Ir(tBuppm)$_3$]).

Next, the light-emitting layer 813b3 was formed over the light-emitting layer 813b2. The light-emitting layer 813b3 was formed to a thickness of 5 nm using a material and a weight ratio similar to those of the light-emitting layer 813b1.

Next, the electron-transport layer 814b1 was formed over the light-emitting layer 813b3. The electron-transport layer 814b1 was formed to a thickness of 10 nm by evaporation of 2mDBTBPDBq-II.

Then, the electron-transport layer 814b2 was formed over the electron-transport layer 814b1. The electron-transport layer 814b2 was formed to a thickness of 15 nm by evaporation of NBphen.

Next, the electron-injection layer 815b was formed over the electron-transport layer 814b2. The electron-injection layer 815b was formed to a thickness of 1 nm by evaporation of lithium fluoride (LiF).

After that, the second electrode 803 was formed over the electron-injection layer 815b. The second electrode 803 was formed in such a manner that silver (Ag) and magnesium (Mg) were deposited by co-evaporation with a volume ratio of 1:0.1 (=Ag:Mg) to have a thickness of 25 nm; then, indium tin oxide (ITO) was formed by a sputtering method to have a thickness of 70 nm. In this example, the second electrode 803 functions as a cathode.

Through the above steps, the light-emitting device in which the EL layer was provided between the pair of electrodes over the substrate 800 was fabricated. The hole-injection layer, the hole-transport layer, the light-emitting layer, the electron-transport layer, the electron-injection layer, and the first layer to the fourth layer described in the above steps are functional layers forming the EL layer in one embodiment of the present invention. In all the evaporation steps in the above fabrication method, an evaporation method by a resistance-heating method was used.

The light-emitting device fabricated as described above was sealed using a different substrate (not illustrated). At the time of the sealing using the different substrate (not illustrated), the different substrate (not illustrated) on which an adhesive that is solidified by ultraviolet light was applied was fixed onto the substrate 800 in a glove box containing a nitrogen atmosphere, and the substrates were bonded to each other such that the adhesive was attached to the periphery of the light-emitting device formed over the substrate 800. At the time of the sealing, the adhesive was irradiated with 365-nm ultraviolet light at 6 J/cm$^2$ to be solidified, and the adhesive was subjected to heat treatment at 80° C. for one hour to be stabilized.

<<Operation Characteristics of Light-Emitting Devices>>

The operation characteristics of Device 1, Device 2, and Comparative Device 3 were measured. Note that the measurement was carried out at room temperature (in an atmosphere maintained at 25° C.).

Figure 10:
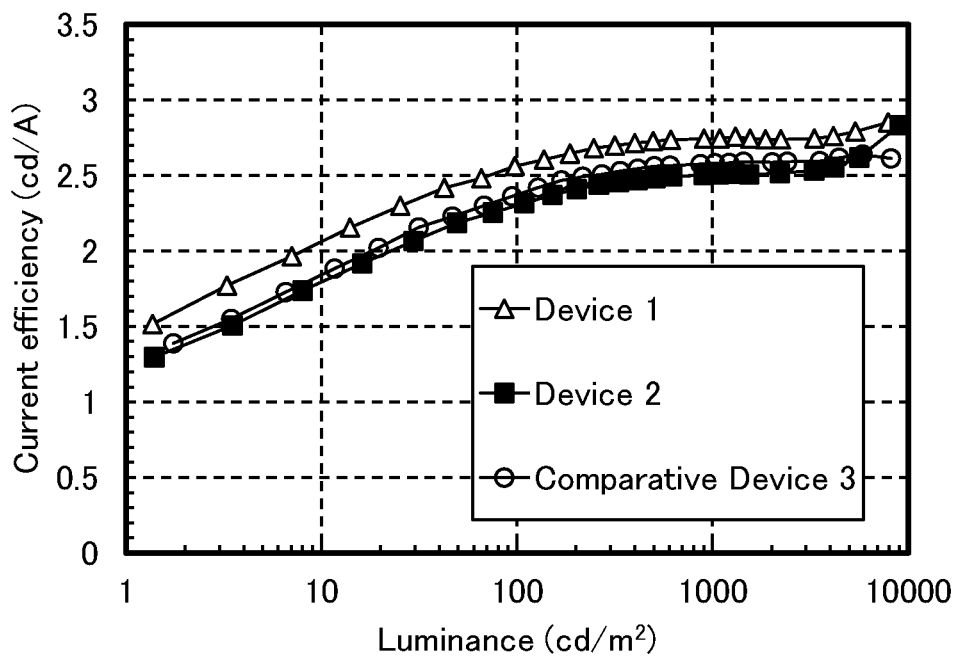
FIG. 10 is a graph showing luminance-current efficiency characteristics of light-emitting devices in Example 1.
Figure 11:
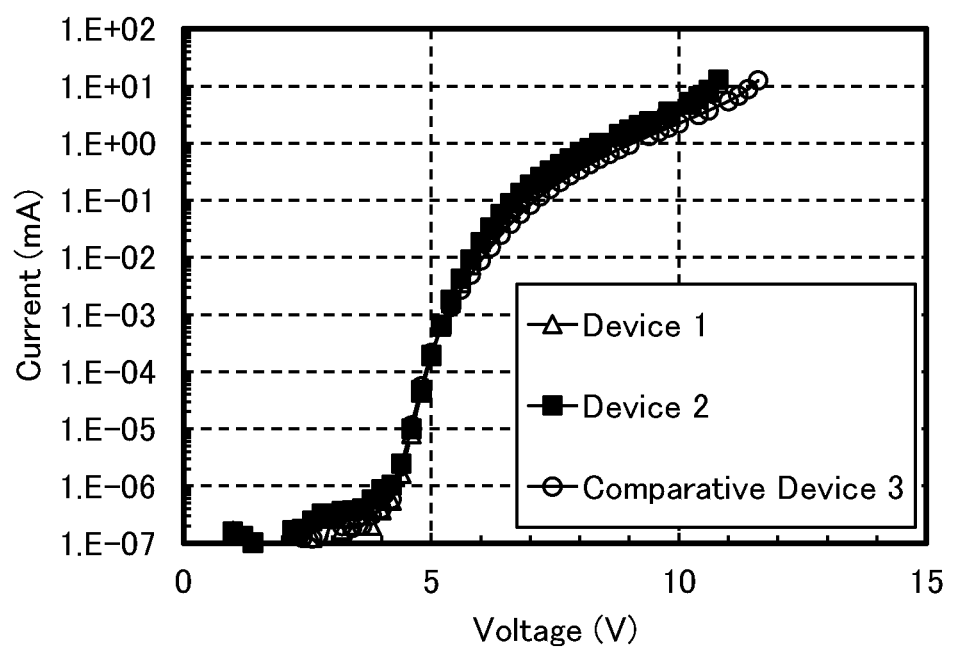
FIG. 11 is a graph showing voltage-current characteristics of the light-emitting devices in Example 1.

FIG. 10 shows the luminance-current efficiency characteristics of each of the light-emitting devices. FIG. 11 shows the voltage-current characteristics of each of the light-emitting devices.

Table 2 shows the initial values of main characteristics of the light-emitting devices at around 1000 cd/m$^2$.

TABLE 2

| | Voltage (V) | Current (mA) | Current density (mA/cm$^2$) | Chromaticity x Chromaticity y | Luminance (cd/m$^2$) | Current efficiency (cd/A) | External quantum efficiency (%) |
|---|---|---|---|---|---|---|---|
| Device 1 | 9.0 | 1.6 | 40 | 0.15 0.03 | 1087 | 2.7 | 6.0 |
| Device 2 | 9.0 | 1.7 | 43 | 0.15 0.03 | 1079 | 2.5 | 5.6 |
| Comparative Device 3 | 9.6 | 1.6 | 40 | 0.15 0.03 | 1027 | 2.6 | 5.8 |

As shown in FIG. 10, FIG. 11, and Table 2, each of the light-emitting devices has high emission efficiency. As shown in FIG. 11, Device 1 and Device 2 have favorable voltage-current characteristics as compared with Comparative Device 3.

Figure 12:
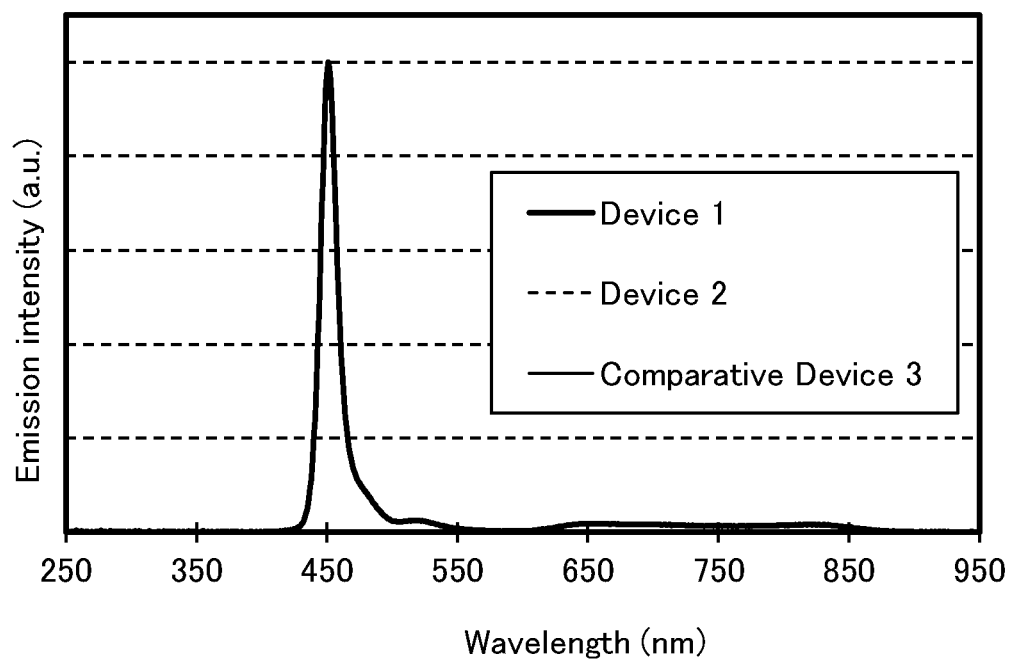
FIG. 12 is a graph showing emission spectra of the light-emitting devices in Example 1.

FIG. 12 shows the emission spectra of the light-emitting devices to which current flows at a current density of 2.5 mA/cm$^2$. As described above, for the light-emitting devices, a microcavity structure that increases the intensity of blue light was employed. As shown in FIG. 12, each of the light-emitting devices exhibited an emission spectrum having a maximum peak at around 451 nm.

<<Reliability Characteristics of Light-Emitting Devices>>

Figure 13:
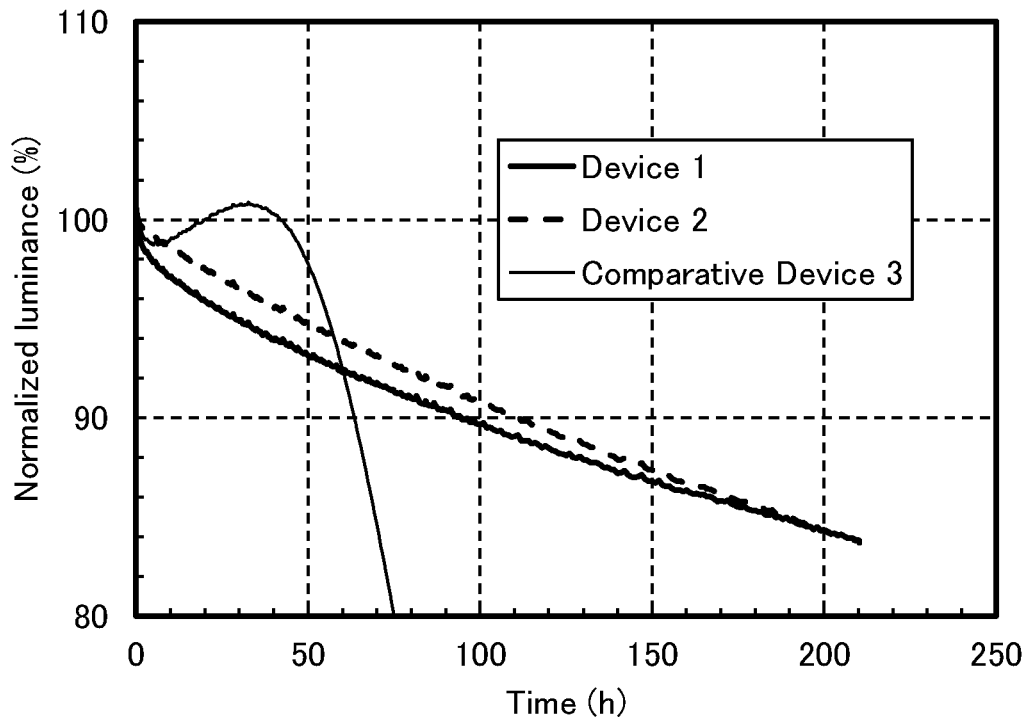
FIG. 13 is a graph showing the results of reliability tests of the light-emitting devices in Example 1.
Figure 14:
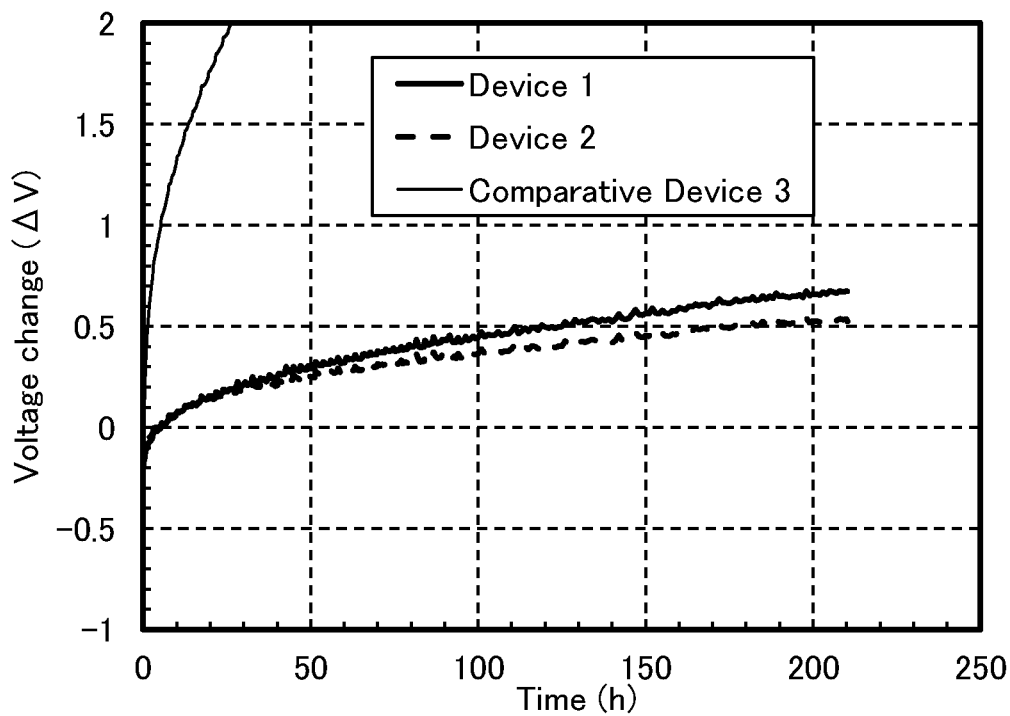
FIG. 14 is a graph showing the results of the reliability tests of the light-emitting devices in Example 1.

Next, a reliability test was performed on each light-emitting device. FIG. 13 and FIG. 14 show the results of the reliability test. In FIG. 13, the vertical axis represents normalized luminance (%) with an initial luminance of 100%, and the horizontal axis represents driving time (h). In FIG. 14, the vertical axis represents a change in voltage (ΔV) when the initial voltage is 0, and the horizontal axis represents driving time (h). In the reliability test, each of the light-emitting devices was driven at a current density of 50 mA/cm$^2$.

As shown in FIG. 13, the luminance in Comparative Device 3 changes largely and is unstable; for example, the luminance increases at the initial driving stage, and then rapidly decreases. In contrast, long-term changes in luminance in Device 1 and Device 2 are smaller than that in Comparative Device 3, and thus Device 1 and Device 2 have high reliability. Specifically, LT90 (the time it takes for the luminance to decrease to 90% of the initial luminance) of Device 1 was 95 hours and LT90 of Device 2 was 112 hours. On the other hand, LT90 of Comparative Device 3 was 64 hours.

As shown in FIG. 14, in Device 1 and Device 2, long-term changes in voltage are small and voltage is less likely to increase as compared with Comparative Device 3.

Device 1 and Device 2 are different from Comparative Device 3 in that the second layer 822 that does not contain Liq is included between the first layer 821 that contains Liq and the third layer 823 that is a Li$_2$O film. A structure in which the second layer 822 is provided between the first layer 821 and the third layer 823 can achieve high reliability of the light-emitting device as compared with a structure in which the first layer 821 and the third layer 823 are provided in contact with each other. Comparison between Device 1 and Device 2 shows that for the second layer 822, an organic compound the same as that in the first layer 821 (ZADN in this example) may be used or a different organic compound (NBphen in this example) may be used.

Example 2

In this example, the results of fabricating and evaluating a light-emitting device of one embodiment of the present invention will be described.

Figure 9B:
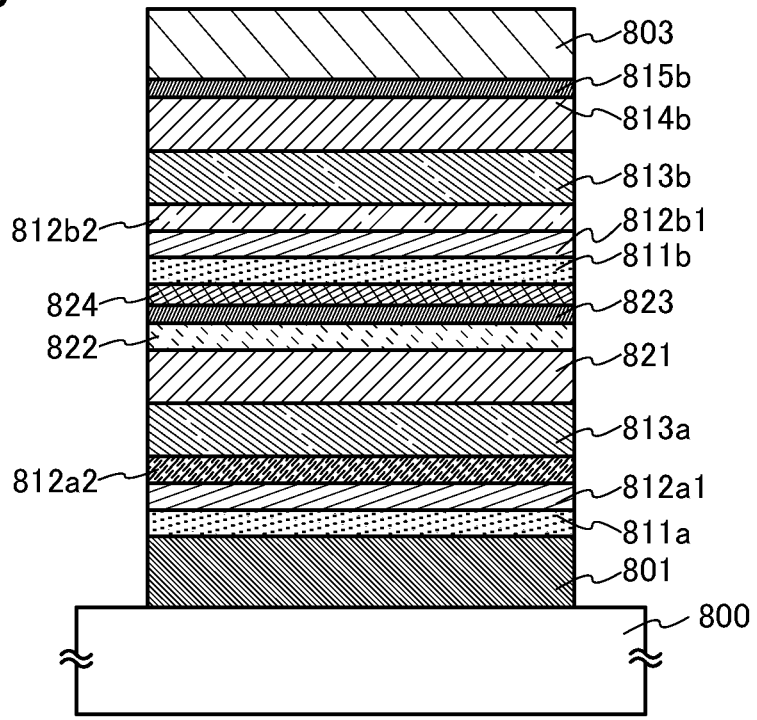

In this example, Device 4 to which one embodiment of the present invention is applied and Comparative Device 5 for comparison were fabricated as light-emitting devices and evaluated, and the results thereof are described. FIG. 9B illustrates the structure of Device 4 and Comparative Device 5 used in this example, and Table 3 shows specific components. Note that for methods of fabricating Device 4 and Comparative Device 5, Example 1 can be referred to. The chemical formulae of the materials used in this example are shown below.

TABLE 3

| | Hole-injection layer 811a | Hole-transport layer 812a1 | Hole-transport layer 812a2 | Light-emitting layer 813a | | Light-emitting layer 813b | Hole-transport layer 812b2 | Hole-transport layer 812b1 | Hole-injection layer 811b | First electrode 801 ITSO (70 nm) | First layer 821 | Second layer 822 | Third layer 823 | Fourth layer 824 | |
|---|---|---|---|---|---|---|---|---|---|---|---|---|---|---|---|
| ↑ | BBABnf:ALD-MP001Q (1:0.1 10 nm) | BBABnf (15 nm) | PCzN2 (10 nm) | * | | * | PCzN2 (10 nm) | BBABnf (55 nm) | BBABnf:ALD-MP001Q (1:0.1 10 nm) | | | ** | | Li₂O (0.1 nm) | CuPc (2 nm) | ↑ |

| | Electron-transport layer 814b | Electron-injection layer 815b | Second electrode 803 Al (200 nm) |
|---|---|---|---|
| ↑ | ZADN:Liq (1:1 25 nm) | Liq (1 nm) | |

| | First layer 821 | Second layer 822 |
|---|---|---|
| ** | | |
| Device 4 | ZADN:Liq (1:1 20 nm) ZADN:Liq (1:1 25 nm) | NBphen 5 nm |
| Comparative Device 5 | | |

* αN-βNPAnth:3,10PCA2Nbf(IV)-02 (1:0.015 25 nm)

[Chemical Formula 3]

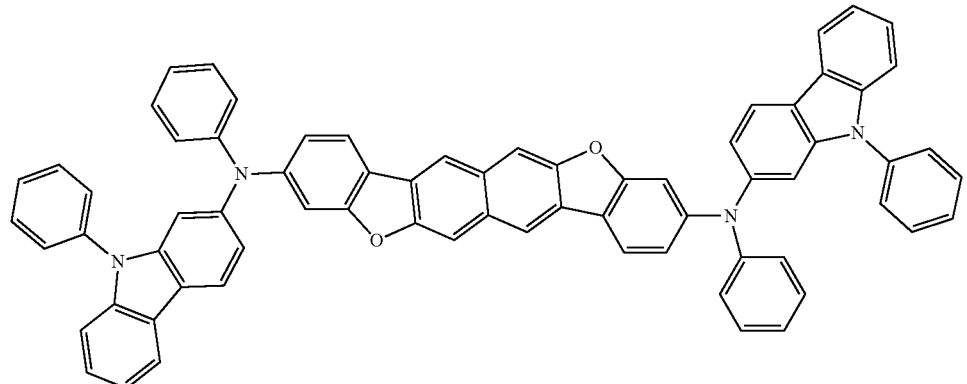

3,10PCA2Nbf(IV)-02

<<Operation Characteristics of Light-Emitting Devices>>

Operation characteristics of Device 4 and Comparative Device 5 were measured. Note that the measurement was carried out at room temperature (an atmosphere maintained at 25° C.).

Figure 15:
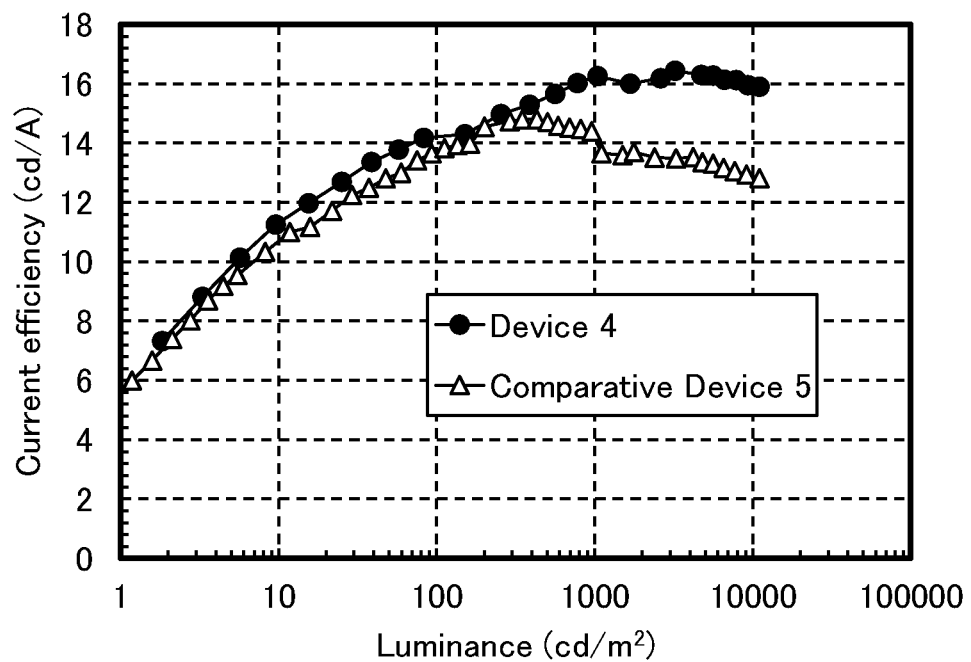
FIG. 15 is a graph showing luminance-current efficiency characteristics of light-emitting devices in Example 2.
Figure 16:
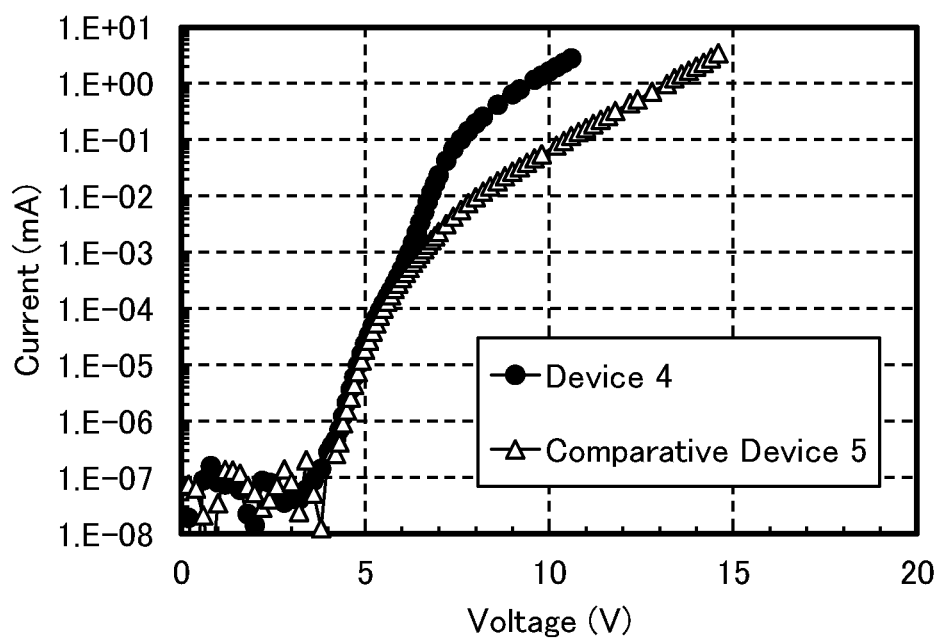
FIG. 16 is a graph showing voltage-current characteristics of the light-emitting devices in Example 2.

FIG. 15 shows the luminance-current efficiency characteristics of the respective light-emitting devices. FIG. 16 shows the voltage-current characteristics of the respective light-emitting devices.

Table 4 shows the initial values of main characteristics of the respective light-emitting devices at around 1000 cd/m$^2$.

The results of the reliability test showed that Device 4 has higher reliability than Comparative Device 5. Specifically, LT95 of Device 4 was 446 hours. On the other hand, LT95 of Comparative Device 5 was less than an hour.

Figure 19:
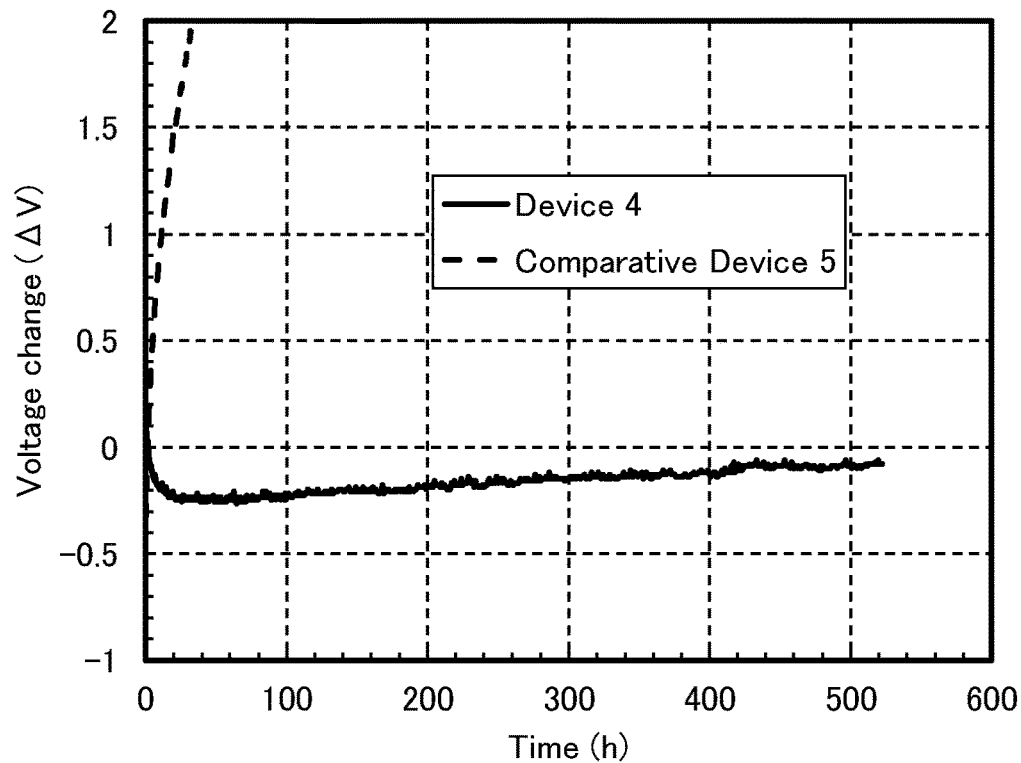
FIG. 19 is a graph showing the results of the reliability tests of the light-emitting devices in Example 2.

As shown in FIG. 19, in Device 4, a long-term change in voltage is small and voltage is less likely to increase as compared with Comparative Device 5.

Device 4 is different from Comparative Device 5 in that the second layer 822 that does not contain Liq is included between the first layer 821 that contains Liq and the third layer 823 that is a Li$_2$O film. A structure in which the second

TABLE 4

| | Voltage (V) | Current (mA) | Current density (mA/cm$^2$) | Chromaticity x Chromaticity y | Luminance (cd/m$^2$) | Current efficiency (cd/A) | External quantum efficiency (%) |
|---|---|---|---|---|---|---|---|
| Device 4 | 8.2 | 0.26 | 6.4 | 0.14 0.09 | 1044 | 16 | 20 |
| Comparative Device 5 | 12 | 0.27 | 6.6 | 0.14 0.09 | 955 | 14 | 19 |

As shown in FIG. 15, FIG. 16, and Table 4, Device 4 has favorable luminance-current efficiency characteristics and voltage-current characteristics as compared with Comparative Device 5.

Figure 17:
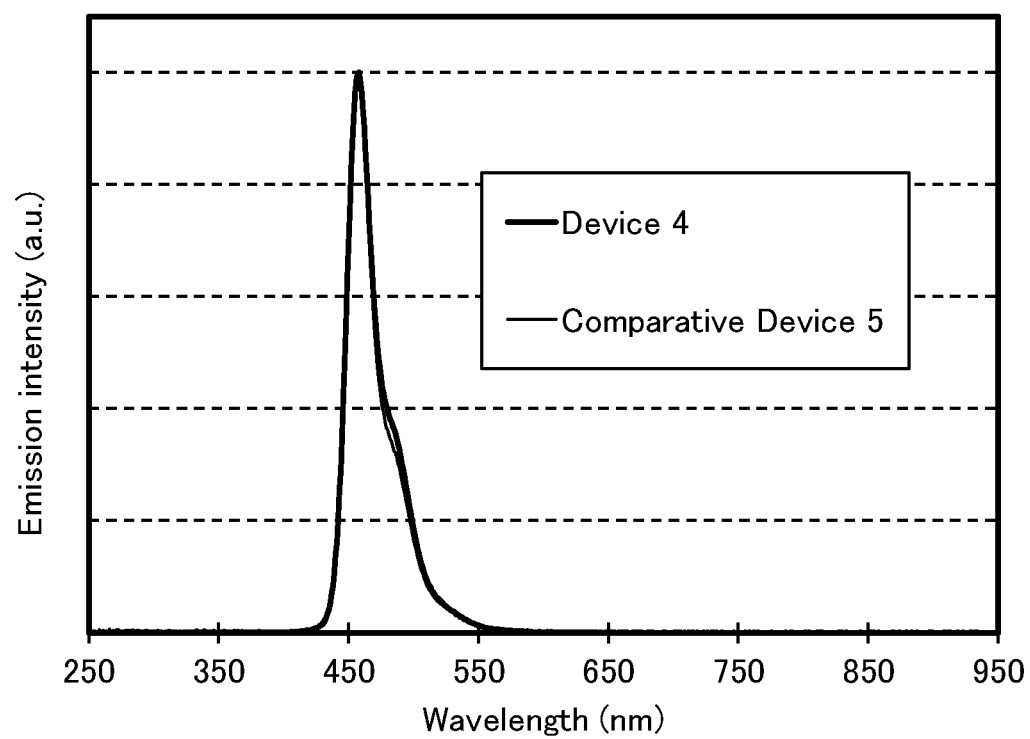
FIG. 17 is a graph showing emission spectra of the light-emitting devices in Example 2.

FIG. 17 shows the emission spectra of the light-emitting devices to which current flows at a current density of 12.5 mA/cm$^2$. Each of the light-emitting devices in this example has a tandem structure in which two light-emitting units emitting blue light are stacked. Each of the light-emitting devices exhibited an emission spectrum with a maximum peak at around 457 nm derived from 3,10-bis[N-(9-phenyl-9H-carbazol-2-yl)-N-phenylamino]naphtho [2,3-b;6,7-b'] bisbenzofuran (abbreviation: 3,10PCA2Nbf(IV)-02) contained in the light-emitting layers 813a and 813b.

<<Reliability Characteristics of Light-Emitting Devices>>

Figure 18:
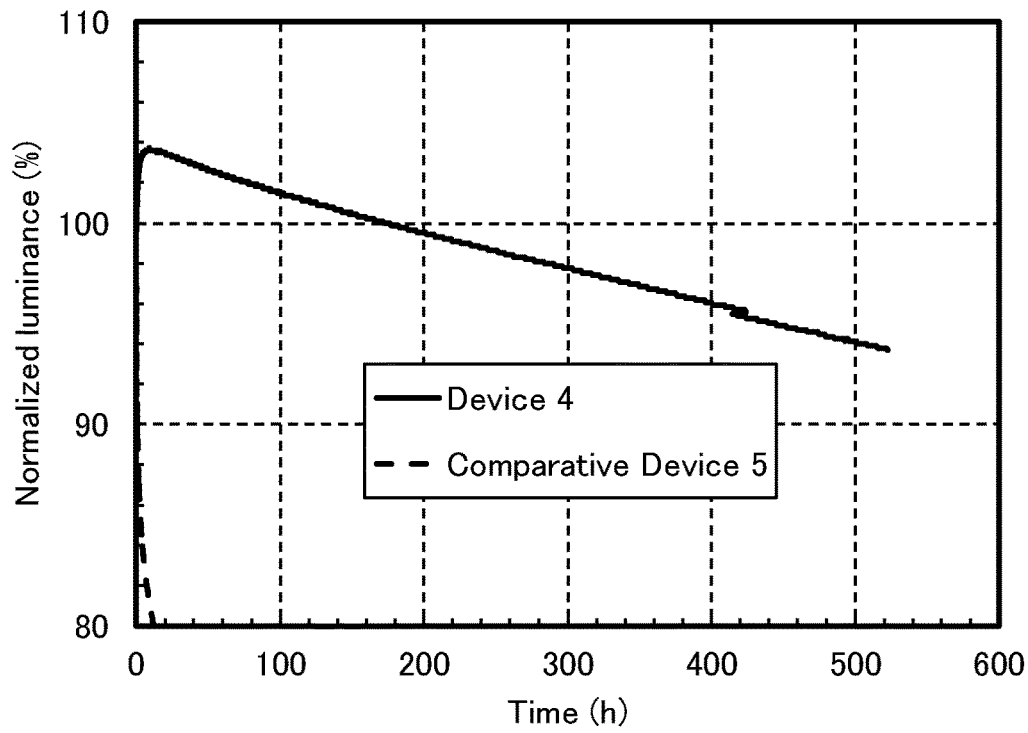
FIG. 18 is a graph showing the results of reliability tests of the light-emitting devices in Example 2.

Next, a reliability test was performed on each light-emitting device. FIG. 18 and FIG. 19 show the results of the reliability test. In FIG. 18, the vertical axis represents normalized luminance (%) with an initial luminance of 100%, and the horizontal axis represents driving time (h). In FIG. 19, the vertical axis represents a change in voltage (ΔV) when the initial voltage is 0, and the horizontal axis represents driving time (h). In the reliability test, each of the light-emitting devices was driven under a condition that an initial luminance was set to 5000 cd/m$^2$.

layer 822 is provided between the first layer 821 and the third layer 823 can achieve high reliability of the light-emitting device as compared with a structure in which the first layer 821 and the third layer 823 are provided in contact with each other.

REFERENCE NUMERALS

201: substrate, 202: insulating layer, 202a: insulating layer, 202b: insulating layer, 203B: light-emitting device, 203G: light-emitting device, 203R: light-emitting device, 203W: light-emitting device, 204: insulating layer, 205: substrate, 206B: color filter, 206G: color filter, 206R: color filter, 207: space, 208: adhesive layer, 209: black matrix, 210: transistor, 211: first electrode, 212G: conductive layer, 212R: conductive layer, 213: EL layer, 215: second electrode, 220B: optical path length, 220G: optical path length, 220R: optical path length, 301: substrate, 302: pixel portion, 303: circuit portion, 304a: circuit portion, 304b: circuit portion, 305: sealing material, 306: substrate, 307: wiring, 308: FPC, 309: transistor, 310: transistor, 311: transistor, 312: transistor, 313: first electrode, 314: insulating layer, 315: EL layer, 316: second electrode, 317: organic EL device, 318: space, 320: transistor, 321: conductive layer, 322a: conductive layer, 322b: conductive layer, 323: conductive layer, 324: insulating layer, 325: insulating layer, 326: insulating layer, 327: semiconductor layer, 327i: channel formation region, 327n: low-resistance region, 328: insulating layer, 330: transistor, 331: conductive layer, 332a: conductive layer, 332b: conductive layer, 333: conductive layer, 334: insulating layer, 335: insulating layer, 337: semiconductor layer, 338: insulating layer, 401: first electrode, 402: EL layer, 403: second electrode, 405: insulating layer, 406: conductive layer, 407: adhesive layer, 416: conductive layer, 420: substrate, 422: adhesive layer, 423: barrier layer, 424: insulating layer, 450: organic EL device, 490a: substrate, 490b: substrate, 490c: barrier layer, 800: substrate, 801: first electrode, 803: second electrode, 811a: hole-injection layer, 811b: hole-injection layer, 812a1: hole-transport layer, 812a2: hole-transport layer, 812b: hole-transport layer, 813a: light-emitting layer, 813b: light-emitting layer, 813b1: light-emitting layer, 813b2: light-emitting layer, 813b3: light-emitting layer, 814b1: electron-transport layer, 814b2: electron-transport layer, 815b: electron-injection layer, 821: first layer, 822: second layer, 823: third layer, 824: fourth layer, 1101: first electrode, 1103: second electrode, 1105a: functional layer, 1105b: functional layer, 1105c: functional layer, 1105d: functional layer, 1111a: hole-injection layer, 1111b: hole-injection layer, 1112a: hole-transport layer, 1112a1: hole-transport layer, 1112a2: hole-transport layer, 1112b: hole-transport layer, 1113a: light-emitting layer, 1113b: light-emitting layer, 1113c: light-emitting layer, 1114b: electron-transport layer, 1115b: electron-injection layer, 1121: first layer, 1122: second layer, 1123: third layer, 1124: fourth layer, 7000: display portion, 7001: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 7600: portable information terminal, 7601: housing, 7602: hinge, 7650: portable information terminal, 7651: non-display portion, 7800: portable information terminal, 7801: band, 7802: input-output terminal, 7803: operation button, 7804: icon, 7805: battery, 9700: automobile, 9701: car body, 9702: wheel, 9703: windshield, 9704: light, 9705: fog lamp, 9710: display portion, 9711: display portion, 9712: display portion, 9713: display portion, 9714: display portion, 9715: display portion, 9721: display portion, 9722: display portion, 9723: display portion

The invention claimed is:

1. A light-emitting device comprising:
a first electrode, a first light-emitting layer, a first layer, a second layer, a third layer, a second light-emitting layer, and a second electrode stacked in this order,
wherein the first layer comprises a first organic compound and a first substance,
wherein the second layer comprises a second organic compound,
wherein the third layer comprises a second substance,
wherein the first organic compound is an electron-transport material,
wherein the first organic compound has a HOMO level higher than or equal to −6.0 eV,
wherein the first substance is a metal, a metallic salt, a metal oxide, or an organometallic salt,
wherein the second organic compound is an electron-transport material,
wherein the second substance comprises an alkali metal, an alkaline earth metal, or a rare earth metal, and
wherein the second layer has a lower concentration of the first substance than the first layer.

2. The light-emitting device according to claim 1, wherein the second layer does not comprise the first substance.

3. The light-emitting device according to claim 1, wherein the first organic compound and the second organic compound are the same organic compound.

4. The light-emitting device according to claim 1, wherein the third layer further comprises a third organic compound, and
wherein the third organic compound is an electron-transport material.

5. The light-emitting device according to claim 4, wherein the third organic compound is the same organic compound as at least one of the first organic compound and the second organic compound.

6. The light-emitting device according to claim 1, wherein the first substance is an organometallic complex comprising an alkali metal or an alkaline earth metal.

7. The light-emitting device according to claim 1, wherein the first substance is an organometallic complex comprising a quinolinol ligand and an alkali metal or an alkaline earth metal.

8. The light-emitting device according to claim 1, wherein the first organic compound has an electron mobility higher than or equal to $1\times10^{-7}$ cm$^2$/Vs and lower than or equal to $5\times10^{-5}$ cm$^2$/Vs when the square root of electric field strength [V/cm] is 600.

9. The light-emitting device according to claim 1, wherein the first layer comprises a first region on the first light-emitting layer side and a second region on the second light-emitting layer side, and
wherein a concentration ratio of the first organic compound to the first substance is different between the first region and the second region.

10. The light-emitting device according to claim 1, wherein the first layer comprises a first region on the first light-emitting layer side and a second region on the second light-emitting layer side, and
wherein the second region has a lower concentration of the first substance than the first region.

11. The light-emitting device according to claim 1, further comprising a hole-injection layer,
wherein the hole-injection layer is positioned between the first electrode and the first light-emitting layer,
wherein the hole-injection layer comprises a first compound and a second compound,
wherein the first compound has an electron-accepting property with respect to the second compound, and
wherein the second compound has a HOMO level higher than or equal to −5.7 eV and lower than or equal to −5.4 eV.

12. The light-emitting device according to claim 11, further comprising a first hole-transport layer,
wherein the first hole-transport layer is positioned between the hole-injection layer and the first light-emitting layer,
wherein the first hole-transport layer comprises a third compound, wherein a HOMO level of the third compound is lower than or equal to the HOMO level of the second compound, and wherein a difference between the HOMO level of the third compound and the HOMO level of the second compound is less than or equal to 0.2 eV.

13. The light-emitting device according to claim 12, wherein each of the second compound and the third compound comprises at least one of a carbazole skeleton, a dibenzofuran skeleton, a dibenzothiophene skeleton, and an anthracene skeleton.

14. The light-emitting device according to claim 12, further comprising a second hole-transport layer, wherein the second hole-transport layer is positioned between the first hole-transport layer and the first light-emitting layer, wherein the second hole-transport layer comprises a fourth compound, and wherein a HOMO level of the fourth compound is lower than the HOMO level of the third compound.

15. The light-emitting device according to claim 14, wherein each of the second compound, the third compound, and the fourth compound comprises at least one of a carbazole skeleton, a dibenzofuran skeleton, a dibenzothiophene skeleton, and an anthracene skeleton.

16. The light-emitting device according to claim 1, wherein the first light-emitting layer comprises a light-emitting substance emitting blue light.

17. A light-emitting apparatus comprising:

the light-emitting device according to claim 1; and at least one of a transistor and a substrate.

18. A light-emitting device comprising:

a first electrode, a first light-emitting layer, a first layer, a second layer, a third layer, a second light-emitting layer, and a second electrode stacked in this order, wherein the first layer comprises a first organic compound and a first substance, wherein the second layer comprises a second organic compound, wherein the third layer comprises a second substance, wherein the first organic compound is an electron-transport material, wherein the first substance is a metal, a metallic salt, a metal oxide, or an organometallic salt, wherein the second organic compound is an electron-transport material, wherein the second substance is an electron-injection material, wherein the first layer comprises a first region on the first light-emitting layer side and a second region on the second light-emitting layer side, and wherein a concentration ratio of the first organic compound to the first substance is different between the first region and the second region.

19. A light-emitting device comprising:

a first electrode, a first light-emitting layer, a first layer, a second layer, a third layer, a second light-emitting layer, and a second electrode stacked in this order, wherein the first layer comprises a first organic compound and a first substance, wherein the second layer comprises a second organic compound, wherein the third layer comprises a second substance, wherein the first organic compound is an electron-transport material, wherein the first organic compound has a HOMO level higher than or equal to −6.0 eV, wherein the first substance is a metal, a metallic salt, a metal oxide, or an organometallic salt, wherein the second organic compound is an electron-transport material, wherein the second substance is an electron-injection material, wherein the second layer does not comprise the first substance, wherein the second organic compound is different from the first organic compound, and wherein the second substance is different from the first substance.

20. The light-emitting device according to claim 18, wherein the first organic compound has a HOMO level higher than or equal to −6.0 eV and an electron mobility higher than or equal to $1\times10^{-7}$ cm$^2$/Vs and lower than or equal to $5\times10^{-5}$ cm$^2$/Vs when the square root of electric field strength [V/cm] is 600.

21. The light-emitting device according to claim 19, wherein the second substance comprises an alkali metal, an alkaline earth metal, or a rare earth metal.

22. The light-emitting device according to claim 19, wherein the first organic compound has an electron mobility higher than or equal to $1\times10^{-7}$ cm$^2$/Vs and lower than or equal to $5\times10^{-5}$ cm$^2$/Vs when the square root of electric field strength [V/cm] is 600.

* * * * *